(12) United States Patent
Nanai et al.

(10) Patent No.: US 9,190,430 B2
(45) Date of Patent: Nov. 17, 2015

(54) METHOD OF FABRICATING DISPLAY PANEL

(71) Applicant: JOLED INC., Tokyo (JP)

(72) Inventors: Norishige Nanai, Osaka (JP); Akihito Miyamoto, Osaka (JP); Takaaki Ukeda, Osaka (JP)

(73) Assignee: JOLED INC., Tokyo (JP)

( * ) Notice: Subject to any disclaimer, the term of this patent is extended or adjusted under 35 U.S.C. 154(b) by 89 days.

(21) Appl. No.: 13/738,343

(22) Filed: Jan. 10, 2013

(65) Prior Publication Data

US 2013/0187177 A1    Jul. 25, 2013

Related U.S. Application Data

(63) Continuation of application No. PCT/JP2011/006386, filed on Nov. 16, 2011.

(51) Int. Cl.
| | |
|---|---|
| *H01L 21/00* | (2006.01) |
| *H01L 33/00* | (2010.01) |
| *H01L 27/12* | (2006.01) |
| *H01L 21/467* | (2006.01) |
| *H01L 27/32* | (2006.01) |

(Continued)

(52) U.S. Cl.
CPC .......... *H01L 27/1288* (2013.01); *H01L 21/467* (2013.01); *H01L 27/1248* (2013.01); *H01L 27/3246* (2013.01); *H01L 27/3248* (2013.01); *H01L 27/3258* (2013.01); *H01L 23/53295* (2013.01); *H01L 33/62* (2013.01); *H01L 51/5203* (2013.01); *H01L 2227/323* (2013.01); *H01L 2924/0002* (2013.01)

(58) Field of Classification Search
CPC ............ H01L 27/3246; H01L 27/1288; H01L 23/53295; H01L 27/1248; H01L 51/5203; H01L 27/3258; H01L 2227/323; H01L 21/467
See application file for complete search history.

(56) References Cited

U.S. PATENT DOCUMENTS

| | | | |
|---|---|---|---|
| 2001/0004134 A1* | 6/2001 | Saitoh | ........................ 257/759 |
| 2003/0230764 A1 | 12/2003 | Yamazaki et al. | |

(Continued)

FOREIGN PATENT DOCUMENTS

| | | |
|---|---|---|
| CN | 1893108 | 1/2007 |
| CN | 102097448 | 6/2011 |

(Continued)

OTHER PUBLICATIONS

ISR issued for PCT/JP2011/006386 (PCT-1575).

(Continued)

*Primary Examiner* — Alonzo Chambliss
(74) *Attorney, Agent, or Firm* — Greenblum & Bernstein, P.L.C.

(57) ABSTRACT

A method of manufacturing a display panel includes a substep of forming a photosensitive material layer for formation of a second layer on a first layer, a sub-step of disposing, over the photosensitive material layer, a photomask having a different degree of transparency in a first region and a second region thereof, the first region overlapping the photosensitive material layer, in plan view, at a location for formation of a second aperture, and the second region being a remainder of the photomask other than the first region, and a sub-step of exposing the photosensitive material layer via the photomask. In plan view, the area of the first region in the photomask is larger than the area of a first aperture in the first layer.

5 Claims, 24 Drawing Sheets

(51) Int. Cl.
H01L 23/532 (2006.01)
H01L 51/52 (2006.01)
H01L 33/62 (2010.01)

(56) References Cited

U.S. PATENT DOCUMENTS

2006/0081849 A1  4/2006  Lee et al.
2007/0007515 A1  1/2007  Suh et al.
2007/0263164 A1  11/2007 Kumagai
2007/0264899 A1  11/2007 Kumagai
2009/0146930 A1  6/2009  Nishimura et al.
2010/0090933 A1  4/2010  Kumagai
2011/0140113 A1  6/2011  Park

FOREIGN PATENT DOCUMENTS

JP  2006-106575  4/2006
JP  2006-114862  4/2006
JP  2007-305357  11/2007
JP  2009-128577  6/2009
JP  2010-166063  7/2010

OTHER PUBLICATIONS

China Office Action, mailed Aug. 5, 2015, by the State Intellectual Property Office of the People's Republic of China (SIPO) for the related Chinese Patent Application No. 201180037873.4 (together with a partial English language translation).

* cited by examiner

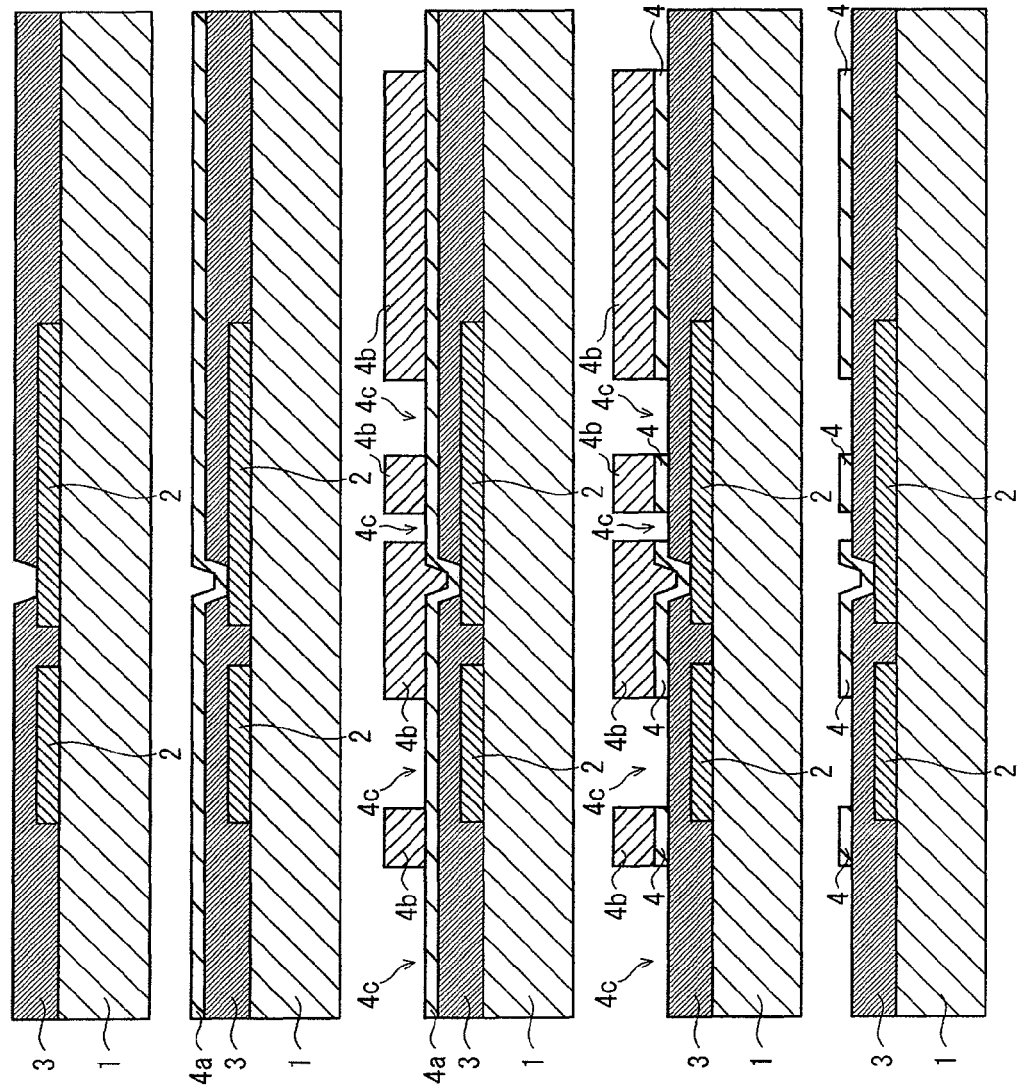

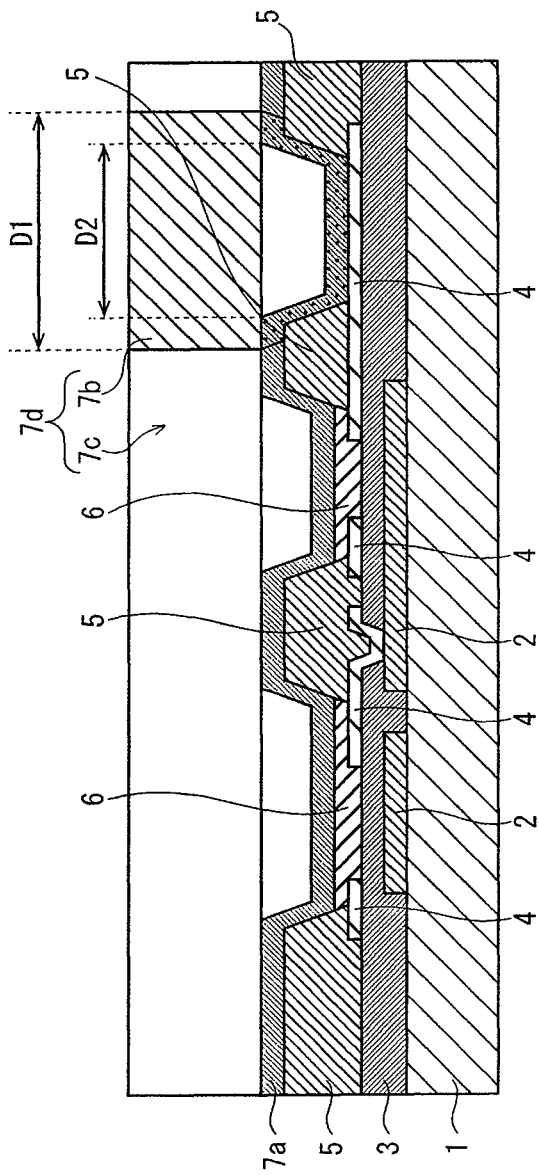
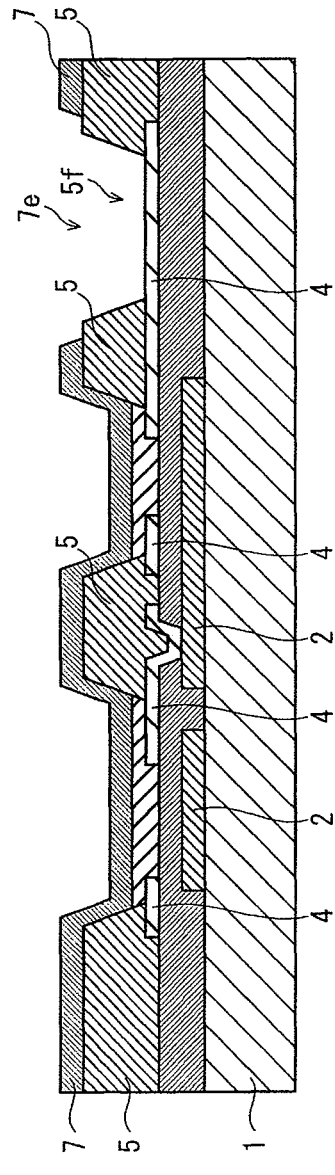
FIG. 5A
FIG. 5B

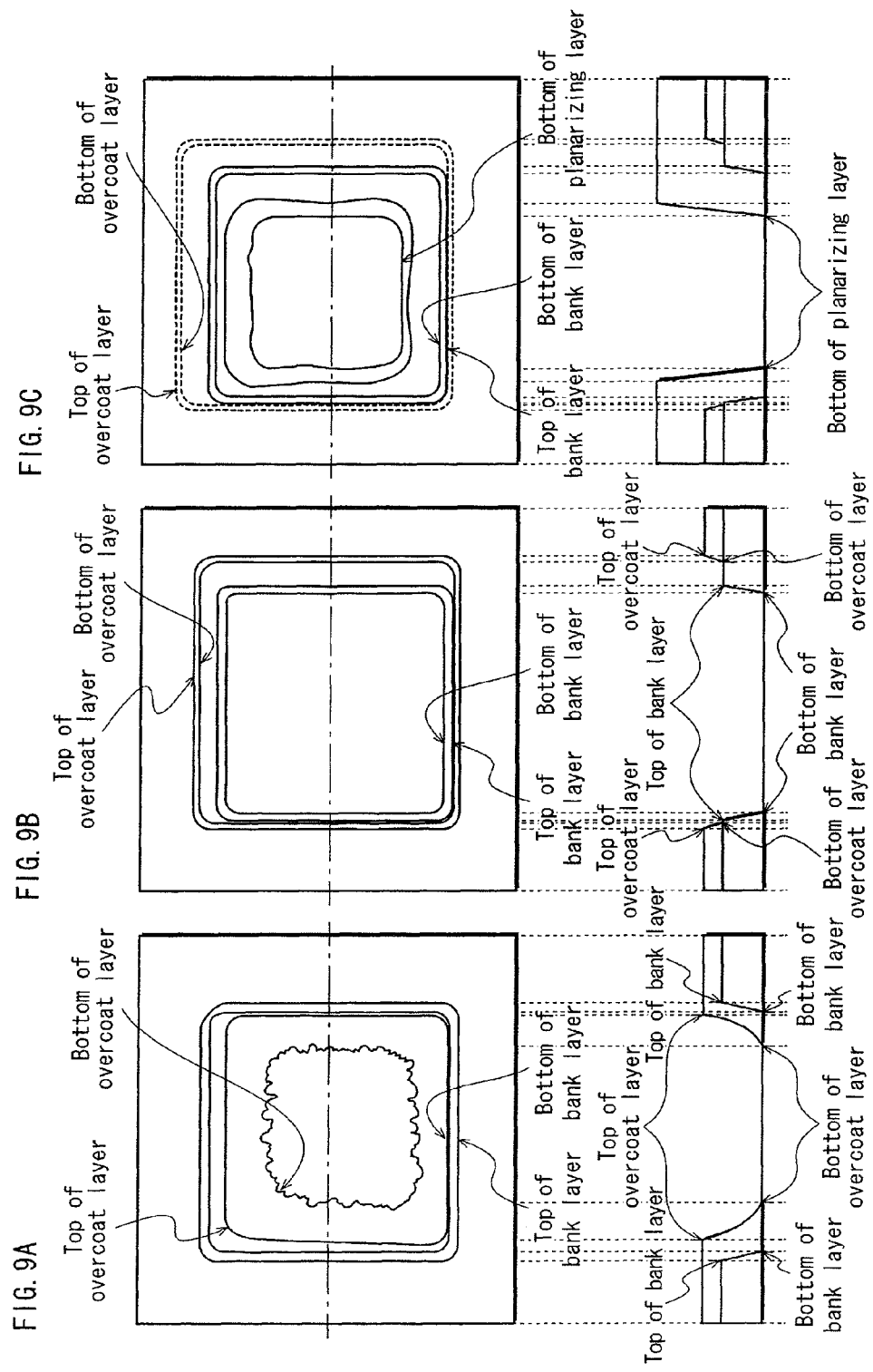

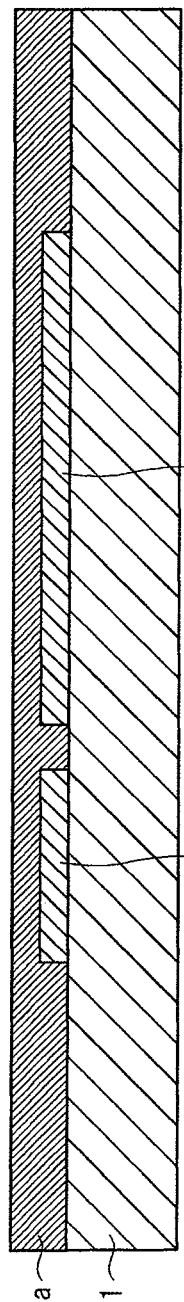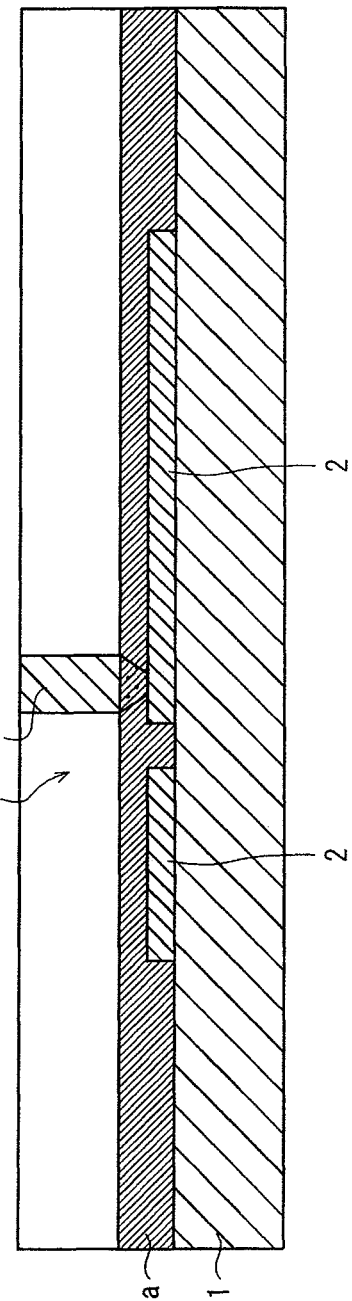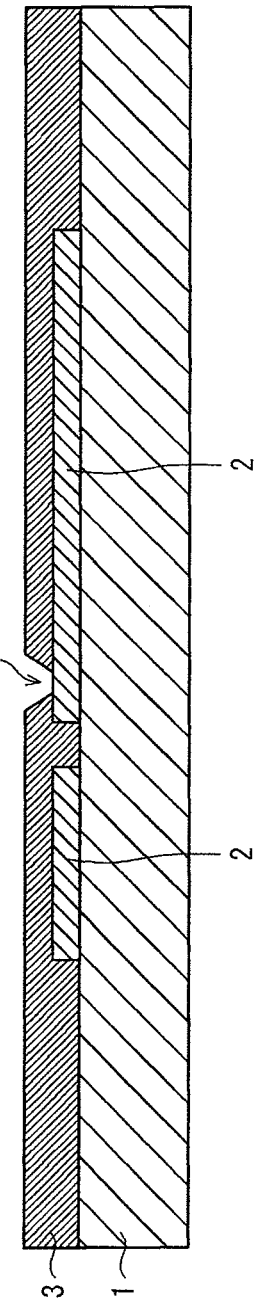

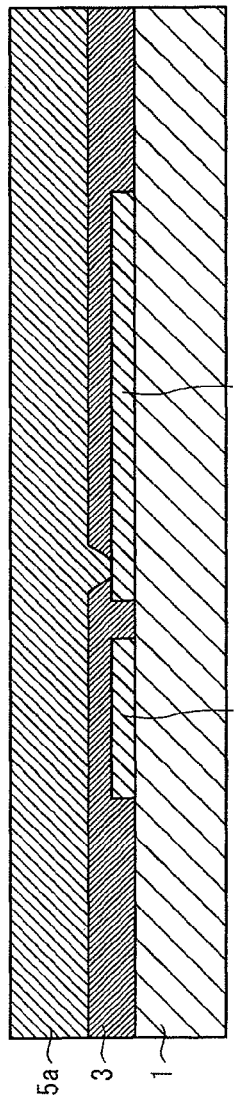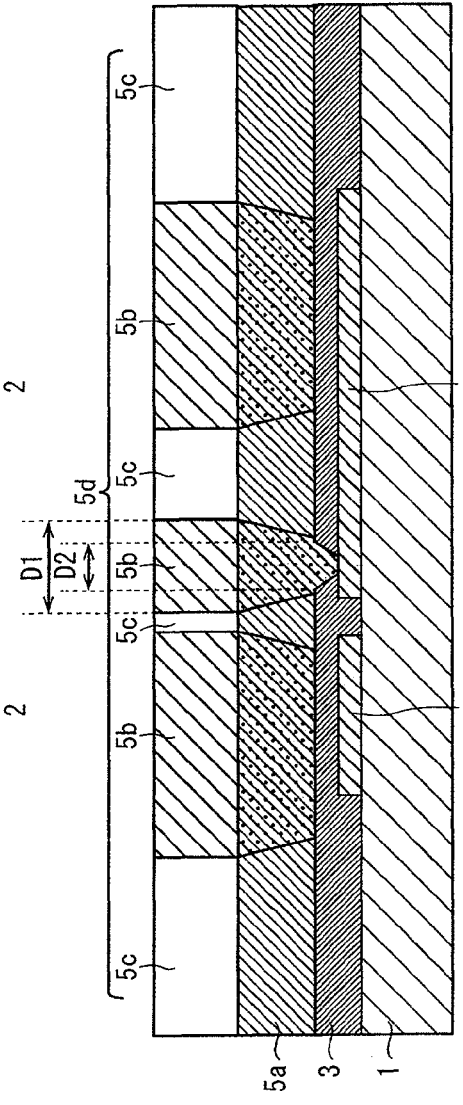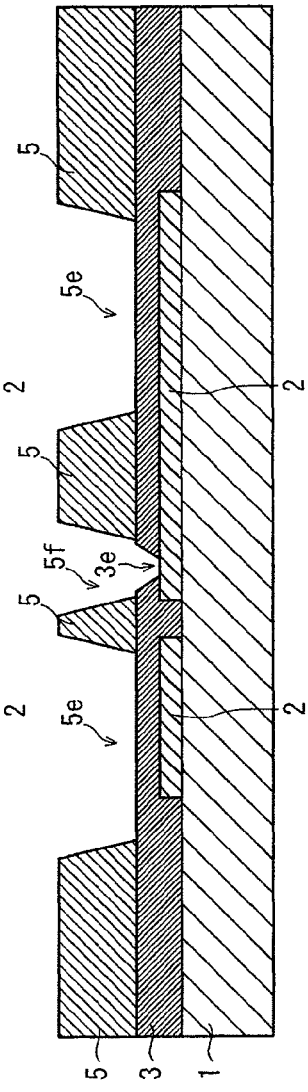
FIG. 13A
FIG. 13B
FIG. 13C

METHOD OF FABRICATING DISPLAY PANEL

CROSS REFERENCE TO RELATED APPLICATION

This is a continuation application of PCT Application No. PCT/JP2011/006386 filed Nov. 16, 2011, designating the United States of America, the disclosure of which, including the specification, drawings and claims, is incorporated herein by reference in its entirety.

TECHNICAL FIELD

The present disclosure relates to a method of manufacturing display panels, such as organic EL (Electro Luminescence) panels, and in particular to technology for forming contact holes.

DESCRIPTION OF THE RELATED ART

In recent years, active matrix organic EL panels provided with a drive circuit in each pixel for driving a light-emitting element have been developed (for example, see Patent Literature 1).

FIG. 24 is a cross-section diagram illustrating the structure of the organic EL panel disclosed in Patent Literature 1. FIG. 24 shows two pixels. The organic EL panel is provided with a substrate 51, gate electrodes 52, a gate insulation film 53, source-drain electrodes 54, semiconductor layers 56, a passivation layer 57, a planarizing film 58, pixel electrodes 59, a bank 60, organic EL layers 61, a common electrode 62, a sealing resin layer 63, a sealing substrate 64, and contact metals 65. The transistor constituting each drive circuit is composed of a gate electrode 52, the gate insulation film 53, a source-drain electrode 54, and a semiconductor layer 56, and is covered by the passivation layer 57 and the planarizing film 58. On the other hand, the light-emitting element is composed of a pixel electrode 59, an organic EL layer 61, and the common electrode 62 and is formed on the planarizing film 58. Contact holes are formed in the passivation layer 57 and the planarizing film 58, and the pixel electrode 59 of the light-emitting element is electrically connected with the source-drain electrode 54 of the drive circuit via the contact metal 65 formed in the contact hole. With regards to formation of contact holes, Patent Literature 1 discloses the steps of forming the passivation layer 57 from silicon nitride, forming the planarizing film 58 from an organic material, and then etching the planarizing film 58 and the passivation layer 57 (paragraph 0048).

CITATION LIST

Patent Literature

[Patent Literature 1]
Japanese Patent Application Publication No. 2007-305357

SUMMARY

With the technology of Patent Literature 1, a first layer is formed, a second layer is then formed thereon, and the first and second layers are etched simultaneously to form the apertures that become the contact holes. In cases such as when photosensitive material is used for the first and second layers, it is sometimes more convenient to form the apertures in the first layer and the apertures in the second layer separately. In this case, the apertures in the first layer are formed, and a photosensitive material layer is formed by applying photosensitive material for forming the second layer onto the first layer. A photomask is then disposed on the photosensitive material layer, and the photosensitive material layer is exposed via the photomask. The photosensitive material layer is then developed in order to form the second layer. Due to exposure via the photomask, the photosensitive material layer is partially removed when developed, thereby forming apertures in the second layer.

The photosensitive material layer, however, conforms to the shape of the first layer underneath. Therefore, when the photosensitive material layer is formed, the portions of the photosensitive material layer within the apertures of the first layer are concave with respect to the portions above the first layer. Therefore, when disposing the photomask on the photosensitive material layer, a gap occurs between the concave portions and the photomask. On the other hand, technology for using a photomask has the problem that regions that should be blocked from light are partially exposed due to stray light. As a result, a portion of the photosensitive material layer that should be removed still remains. In particular, as the size of the gap between the photomask and the photosensitive material layer increases, the distance over which light strays also increases, making this a salient problem. The distance over which light strays thus increases in the concave portions of the photosensitive material layer, which are the portions where the apertures of the second layer to be formed, and the portions of the photosensitive material layer that should have been removed but that remain increase in size. In some cases, it becomes difficult to guarantee that the contact holes have a sufficient area.

One non-limiting and exemplary embodiment provides a technique for more easily guaranteeing the area of the contact holes by reducing the size of the portions of the photosensitive material layer that should have been removed but that remain due to stray light when the contact holes are formed.

A method of manufacturing a display panel according to an aspect of the present invention comprises the steps of: preparing a substrate with an electrode on an upper surface thereof; forming, on the substrate, a first layer including a first aperture overlapping the electrode in plan view; forming, on the first layer, a second layer including a second aperture overlapping the first aperture in plan view; and forming a wiring layer, in contact with the electrode, inside the overlapping first aperture and second aperture, wherein the second layer is formed from a photosensitive material, formation of the second layer includes the sub-steps of: forming, on the first layer, a photosensitive material layer for formation of the second layer; disposing, over the photosensitive material layer, a photomask having a different degree of transparency in a first region and a second region thereof, the first region overlapping the photosensitive material layer, in plan view, at a location for formation of the second aperture, and the second region being a remainder of the photomask other than the first region; and exposing the photosensitive material layer via the photomask, and in plan view, an area of the first region in the photomask is larger than an area of the first aperture in the first layer.

In the above structure, the area of the first region in the photomask is larger than the area of the first aperture in the first layer. Therefore, when disposing the photomask on the photosensitive material layer, the boundary between the first region and the second region, which have a different degree of transparency, is located above a portion of the photosensitive material layer formed on the first layer. Since the gap between the photomask and the photosensitive material layer at this position is small, the distance over which light strays is short, thereby reducing the size of the portion of the photosensitive material layer that should have been removed but that remains. This makes it easier to guarantee the area of the contact hole.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 2A, 2B, 2C, 2D, and 2E are cross-section diagrams illustrating the manufacturing process of the display panel in FIG. 1;

FIGS. 5A and 5B are cross-section diagrams illustrating the manufacturing process of the display panel in FIG. 1;

FIGS. 9A, 9B, and 9C are traced drawings and cross-section diagrams of the photographs in FIG. 8;

FIGS. 12A, 12B, and 12C are cross-section diagrams illustrating the manufacturing process of the display panel in FIG. 11;

FIGS. 13A, 13B, and 13C are cross-section diagrams illustrating the manufacturing process of the display panel in FIG. 11;

DETAILED DESCRIPTION

Figure 1:
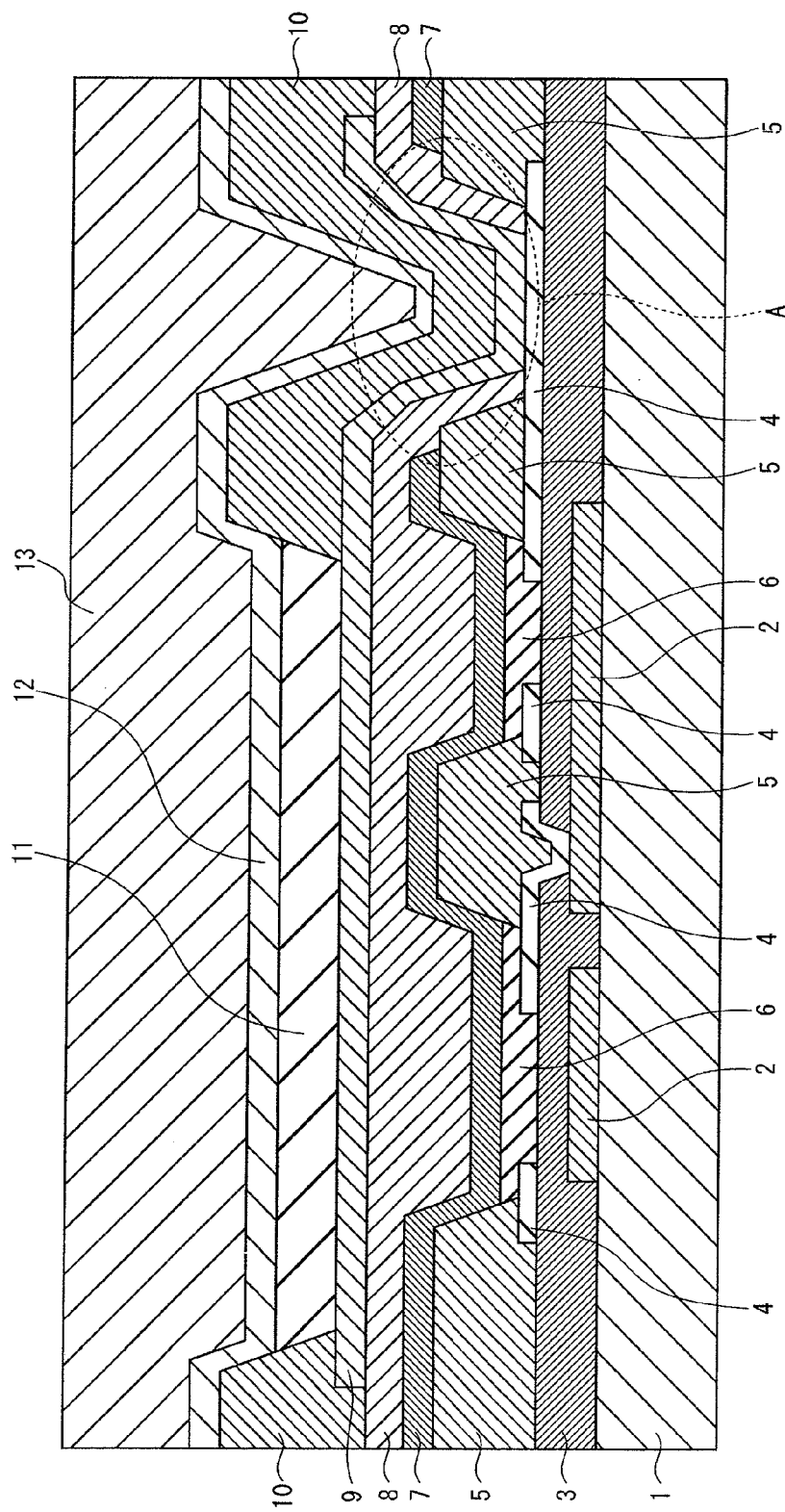
FIG. 1 is a cross-section diagram illustrating the structure of a display panel according to Embodiment 1 of the present disclosure.

Outline of an Aspect of the Present Invention

A method of manufacturing a display panel according to an aspect of the present invention comprises the steps of: preparing a substrate with an electrode on an upper surface thereof; forming, on the substrate, a first layer including a first aperture overlapping the electrode in plan view; forming, on the first layer, a second layer including a second aperture overlapping the first aperture in plan view; and forming a wiring layer, in contact with the electrode, inside the overlapping first aperture and second aperture, wherein the second layer is formed from a photosensitive material, formation of the second layer includes the sub-steps of: forming, on the first layer, a photosensitive material layer for formation of the second layer; disposing, over the photosensitive material layer, a photomask having a different degree of transparency in a first region and a second region thereof, the first region overlapping the photosensitive material layer, in plan view, at a location for formation of the second aperture, and the second region being a remainder of the photomask other than the first region; and exposing the photosensitive material layer via the photomask, and in plan view, an area of the first region in the photomask is larger than an area of the first aperture in the first layer.

In the above structure, the area of the first region in the photomask is larger than the area of the first aperture in the first layer. Therefore, when disposing the photomask on the photosensitive material layer, the boundary between the first region and the second region, which have a different degree of transparency, is located above a portion of the photosensitive material layer formed on the first layer. Since the gap between the photomask and the photosensitive material layer at this position is small, the distance over which light strays is short, thereby reducing the size of the portion of the photosensitive material layer that should have been removed but that remains. This makes it easier to guarantee the area of the contact hole.

The first layer may be thicker than the second layer.

The first layer may be a bank layer including, at a different position than the first aperture, a third aperture in which a functional material layer is formed, and the second layer may be an overcoat layer for covering the functional material layer in the third aperture.

The first layer may be a gate insulation film, and the second layer may be a bank layer including, at a different position than the second aperture, a third aperture in which a functional material layer is formed.

The first layer may be formed from a photosensitive material, formation of the first layer may include the sub-steps of: forming, on the substrate, a photosensitive material layer for formation of the first layer; disposing, over the photosensitive material layer for formation of the first layer, a photomask having a different degree of transparency in a first region and a second region thereof, the first region overlapping the photosensitive material layer for formation of the first layer, in plan view, at a location for formation of the first aperture, and the second region being a remainder of the photomask other than the first region; and exposing the photosensitive material layer via the photomask, and in plan view, an area of the first region in the photomask used in formation of the second layer may be larger than an area of the first region in the photomask used in formation of the first layer.

A display panel according to an aspect of the present invention comprises: a substrate having an electrode on an upper surface thereof; a first layer, on the substrate, including a first aperture overlapping the electrode in plan view; a second layer, on the first layer, including a second aperture overlapping the first aperture in plan view; and a wiring layer, in contact with the electrode, inside the overlapping first aperture and second aperture, wherein in plan view, an area of the second aperture is larger than an area of the first aperture.

The following embodiments are described in detail with reference to the drawings.

Embodiment 1

Overall Configuration

FIG. 1 is a cross-section diagram illustrating the structure of a display panel according to Embodiment 1 of the present disclosure. FIG. 1 shows one pixel. The display panel is provided with a substrate 1, gate electrodes 2, a gate insulation film 3, source-drain electrodes 4, a bank layer 5, semiconductor layers 6, an overcoat layer 7, a planarizing layer 8, pixel electrodes 9, a bank layer 10, organic EL layers 11, a common electrode 12, and a sealing layer 13. The transistor constituting each drive circuit is composed of a gate electrode 2, the gate insulation film 3, a source-drain electrode 4, and a semiconductor layer 6. Each transistor is an inorganic TFT (Thin Film Transistor) or an organic TFT. In the present embodiment, two transistors are used in each pixel. The light-emitting element is composed of a pixel electrode 9, an organic EL layer 11, and the common electrode 12. The insulating layer located between the drive circuit and the light-emitting element is composed of the bank layer 5, the overcoat layer 7, and the planarizing layer 8. In section A of FIG. 1, the bank layer 5, the overcoat layer 7, and the planarizing layer 8 each have an aperture at a position overlapping the source-drain electrode 4 in plan view. These apertures form a contact hole. A portion of the pixel electrode 9 enters into the contact hole along the inner circumferential surface thereof and contacts with the source-drain electrode 4 that is exposed at the bottom of the contact hole. The portion of the pixel electrode 9 located within the contact hole functions as a wiring layer that contacts with the source-drain electrode 4.

Structure of Each Layer

The substrate 1 may be formed from a well-known material such as resin or glass.

The gate electrode 2, the gate insulation film 3, the source-drain electrode 4, and the semiconductor layer 6 may be formed from a well-known material used in inorganic TFTs or organic TFTs. Note that in the present embodiment, the material used for the semiconductor layers 6 is a material that can be used in an application method such as the inkjet method.

The bank layer 5 is formed from material that is insulating and photosensitive and is mainly provided for the purpose of preventing ink, which includes material for the semiconductor layers 6, from flowing outside of the target position when the semiconductor layers 6 are formed by an application method. In the bank layer 5, apertures for formation of the semiconductor layers 6 by an application method, as well as apertures for formation of the contact holes, are formed.

The overcoat layer 7 is formed from material that is insulating and photosensitive and is mainly provided for the purpose of covering the semiconductor layers 6. In the overcoat layer 7, apertures for formation of the contact holes are formed.

The planarizing layer 8 is formed from material that is insulating and photosensitive and is mainly provided for the purpose of planarizing the upper surface. In the planarizing layer 8, apertures for formation of the contact holes are formed.

The pixel electrodes 9, the organic EL layers 11, and the common electrode 12 may all be formed using well-known material used in the formation of organic EL elements. Each organic EL layer 11 includes a light-emitting layer and, as necessary, a hole injection layer, a hole transport layer, an electron injection layer, and an electron transport layer.

The bank layer 10 is formed from material that is insulating and photosensitive and is mainly provided for the purpose of preventing ink, which includes material for the organic EL layers 11, from flowing outside of the target position when the organic EL layers 11 are formed by an application method.

The sealing layer 13 is formed from material that is insulating and photosensitive and is mainly provided for the purpose of preventing water or gas from entering into the light-emitting elements or the drive circuits.

Manufacturing Method

FIGS. 2A through 7 are cross-section diagrams illustrating the manufacturing process of the display panel in FIG. 1.

First, the substrate 1 is prepared, and then the gate electrodes 2 and gate insulation film 3 are formed on the substrate 1 (FIG. 2A). The gate electrodes 2 are, for example, formed by the steps of layering conductive material that forms the gate electrodes on the substrate 1, forming a resist pattern thereon, etching the conductive material via the resist pattern, and removing the resist pattern. The gate insulation film 3 includes contact holes for allowing the gate electrodes 2 and the source-drain electrodes 4 to come into contact. The gate insulation film 3 is, for example, formed by the steps of forming a gate insulation material layer, for formation of the gate insulation film, on the substrate 1 on which the gate electrodes 2 are formed, disposing a photomask, exposing the gate insulation material layer via the photomask, and then developing the gate insulation material layer.

Next, an SD material layer 4a for forming the source-drain electrodes 4 is layered on the gate insulation film 3 (FIG. 2B), a resist pattern 4b including apertures 4c is formed thereon (FIG. 2C), the SD material layer 4a is etched via the resist pattern 4b (FIG. 2D), and the resist pattern 4b is removed (FIG. 2E). The above steps allow for formation of a substrate underlayer having the source-drain electrodes 4 formed on the upper surface thereof. Note that the source-drain electrodes 4 may be a single layer structure or a multilayer structure. In the case of a single layer structure, the source-drain electrodes 4 may be formed in one step, thereby simplifying the manufacturing process. In the case of a multilayer structure, appropriate material for each layer may be selected in accordance with function, such as a material that adheres tightly to the underlayer for the lower layer, and a material with high electrical conductivity for the upper layer. One example is using titanium (Ti) with a thickness of several nanometers as the material for the lower layer and gold (Au) with a thickness of 50 nm to 100 nm as the material for the upper layer.

Figures 3A, 3B, 3C:
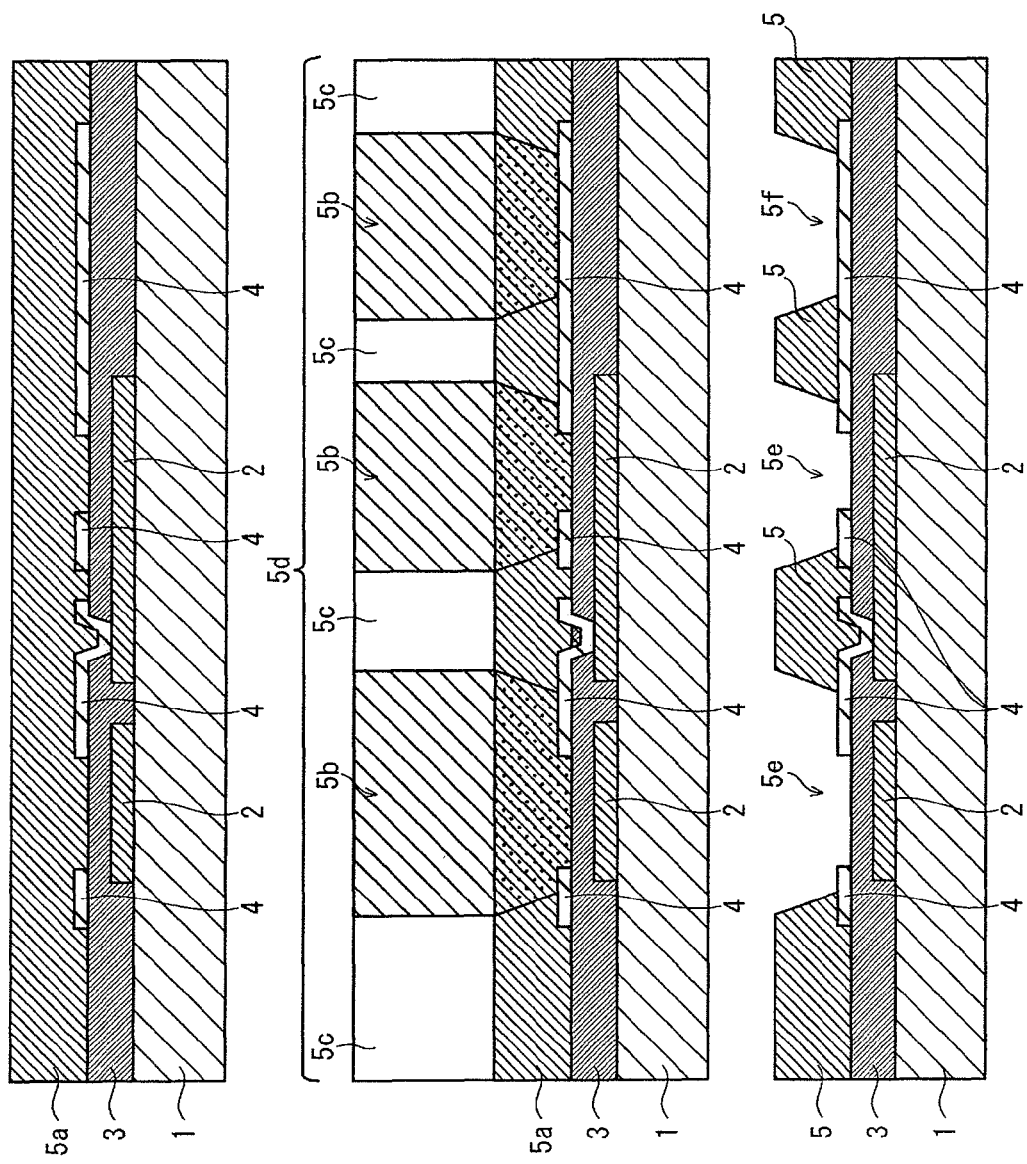
FIGS. 3A, 3B, and 3C are cross-section diagrams illustrating the manufacturing process of the display panel in FIG. 1.

Next, a bank material layer 5a for forming the bank layer 5 is formed on the substrate underlayer on which the source-drain electrodes 4 are formed (FIG. 3A) and a photomask 5d is disposed on the bank material layer 5a. The bank material layer 5a is then exposed via the photomask 5d (FIG. 3B) and subsequently developed. This results in formation of the bank layer 5 which has apertures 5e for the formation of the semiconductor layers 6 and apertures 5f for the formation of the contact holes (FIG. 3C). Note that the photomask 5d includes light-blocking regions 5b with an extremely low degree of transparency and aperture regions 5c with an extremely high degree of transparency. In the present embodiment, the material for the bank layer 5 is a photosensitive material such that during developing, unexposed portions are removed, whereas exposed portions remain. Therefore, in plan view of the photomask 5d, the light-blocking regions 5b overlap the portions of the bank material layer 5a in which the apertures are to be formed, whereas the aperture regions 5c overlap the remaining regions.

Figure 4A:
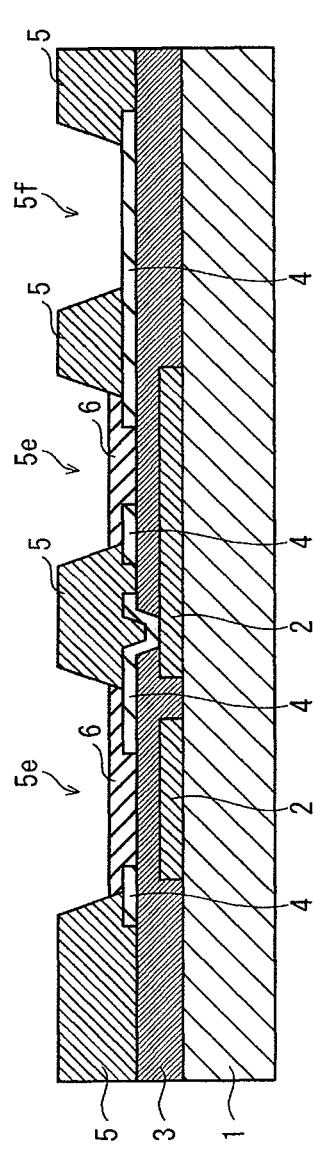
FIGS. 4A and 4B are cross-section diagrams illustrating the manufacturing process of the display panel in FIG. 1.
Figure 4B:
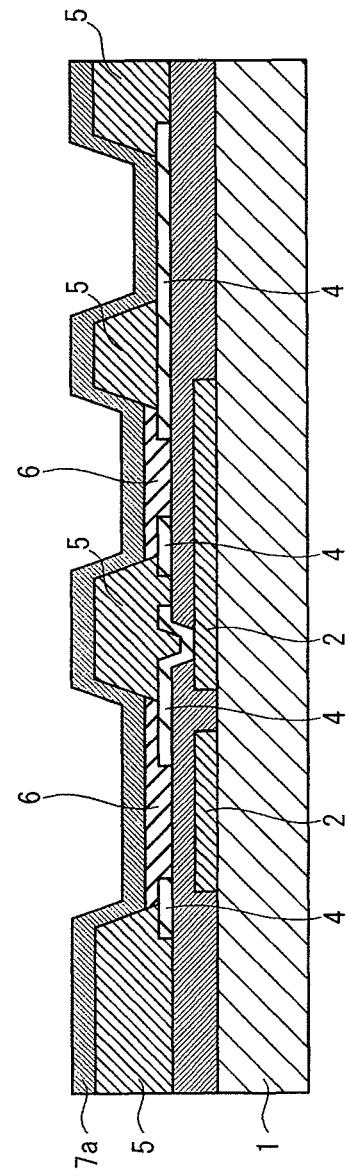

Next, the semiconductor layers 6 are formed in the apertures 5e of the bank layer 5 (FIG. 4A). The semiconductor layers 6 are, for example, formed by the steps of applying ink including solvent and semiconductor material for forming semiconductor layers 6 into the apertures 5e and then causing the solvent to evaporate, so that the semiconductor material remains.

Next, an overcoat material layer 7a for forming the overcoat layer 7 is formed on the bank layer 5 on which the semiconductor layers 6 are formed (FIG. 4B), and a photomask 7d is disposed on the overcoat material layer 7a. The overcoat material layer 7a is then exposed via the photomask 7d (FIG. 5A) and subsequently developed. As a result, the overcoat layer 7 is formed to include apertures 7e for the formation of the contact holes (FIG. 5B). Note that the photomask 7d includes light-blocking regions 7b with an extremely low degree of transparency and aperture regions 7c with an extremely high degree of transparency. In the present embodiment, the material for the overcoat layer 7 is a photosensitive material such that during developing, unexposed portions are removed, whereas exposed portions remain, as in the case of the bank layer 5. Therefore, in plan view of the photomask 7d, the light-blocking regions 7b overlap the portions of the overcoat material layer 7a in which the apertures are to be formed, whereas the aperture regions 7c overlap the remaining regions. In plan view, the area of the light-blocking regions 7b in the photomask 7d is larger than the area of the apertures 5f in the bank layer 5. In other words, as shown in FIG. 5A, the radius D1 of each of the light-blocking region 7b in the photomask 7d is larger than the radius D2 of each of the apertures in the bank layer 5. This difference in size guarantees the area of the contact holes even if stray light occurs during exposure using the photomask 7d. Experiment results that confirm this advantageous effect are described below.

Figures 6A, 6B, 6C:
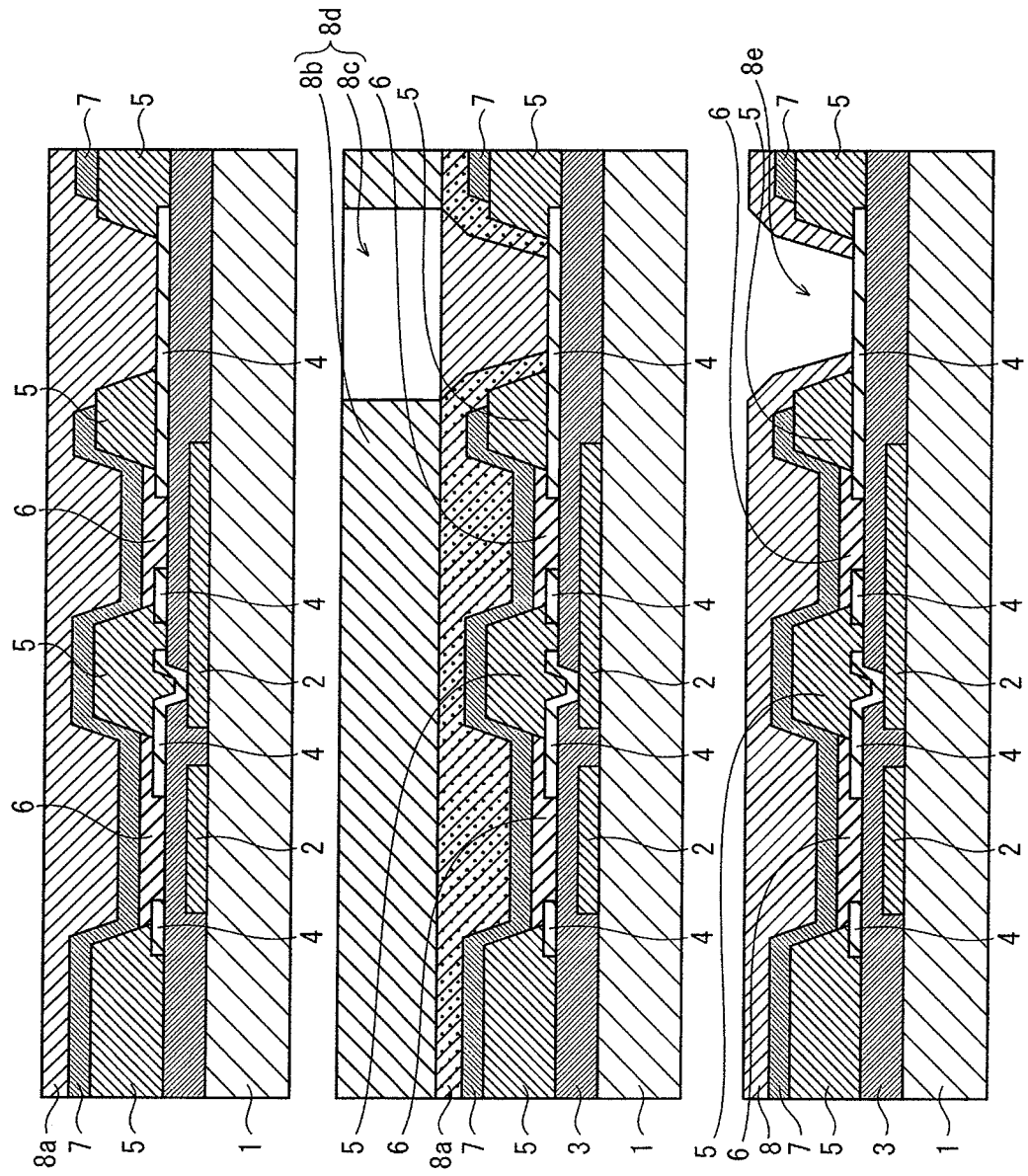
FIGS. 6A, 6B, and 6C are cross-section diagrams illustrating the manufacturing process of the display panel in FIG. 1.

Next, a planarizing material layer 8a for forming the planarizing layer 8 is formed on the overcoat layer 7 in which apertures have been formed (FIG. 6A), and a photomask 8d is disposed on the planarizing material layer 8a. The planarizing material layer 8a is exposed via the photomask 8d (FIG. 6B) and then developed. As a result, the planarizing layer 8 is formed so as to include contact holes 8e (FIG. 6C). Note that the photomask 8d includes light-blocking regions 8b with an extremely low degree of transparency and aperture regions 8c with an extremely high degree of transparency. In the present embodiment, the material for the planarizing layer 8 is a photosensitive material such that during developing, exposed portions are removed, whereas unexposed portions remain, unlike the bank layer 5. Therefore, in plan view of the photomask 8d, the aperture regions 8c overlap the portions of the bank material layer 8a in which the apertures are to be formed, whereas the light-blocking regions 8b overlap the remaining regions.

Figure 7:
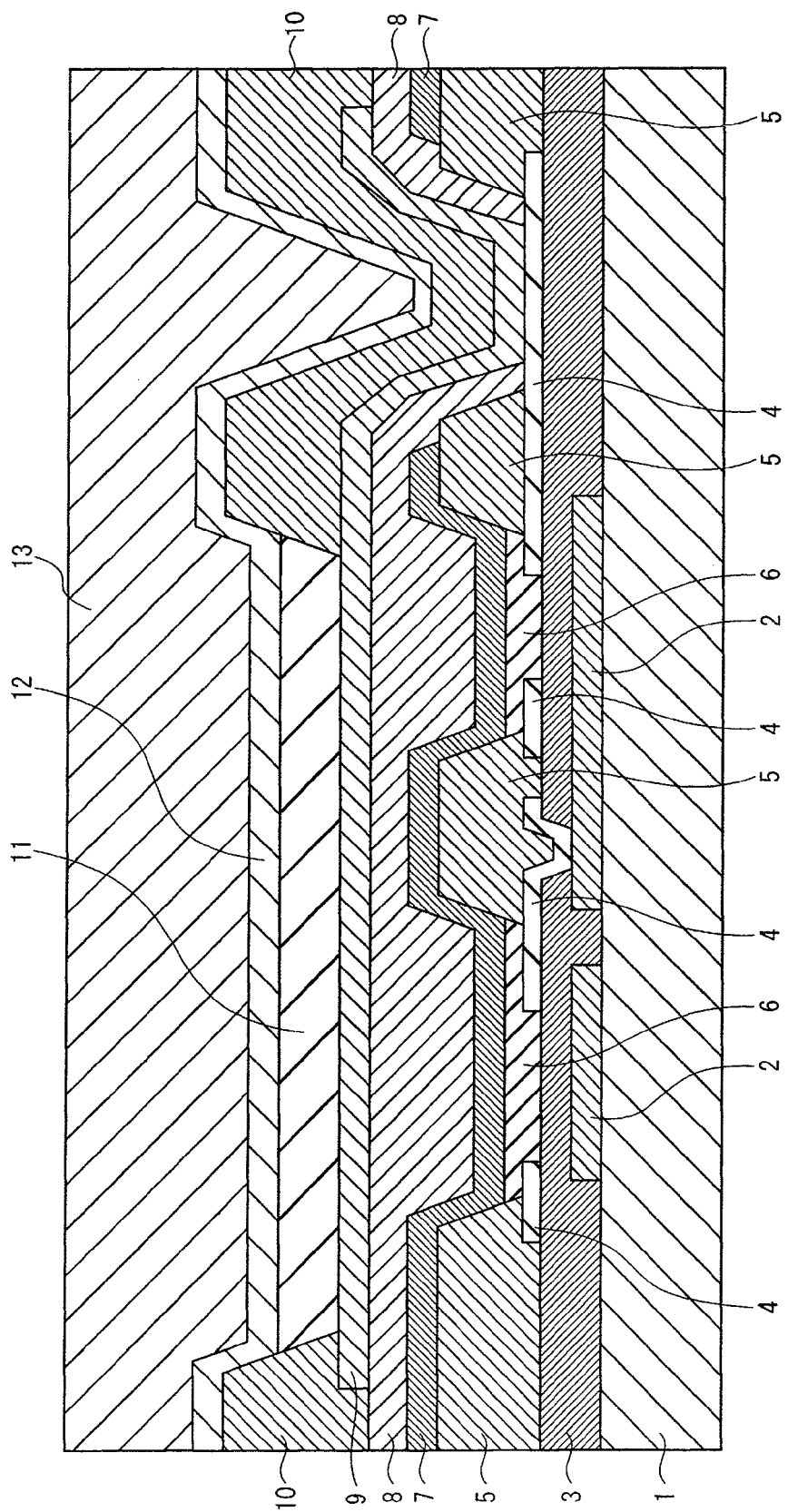
FIG. 7 is a cross-section diagram illustrating the manufacturing process of the display panel in FIG. 1.

Subsequently, the display panel is formed by forming the pixel electrodes 9, the bank layer 10, the organic EL layers 11, the common electrode 12, and the sealing layer 13 in this order (FIG. 7).

Experiment Results

Figures 8A, 8B, 8C:
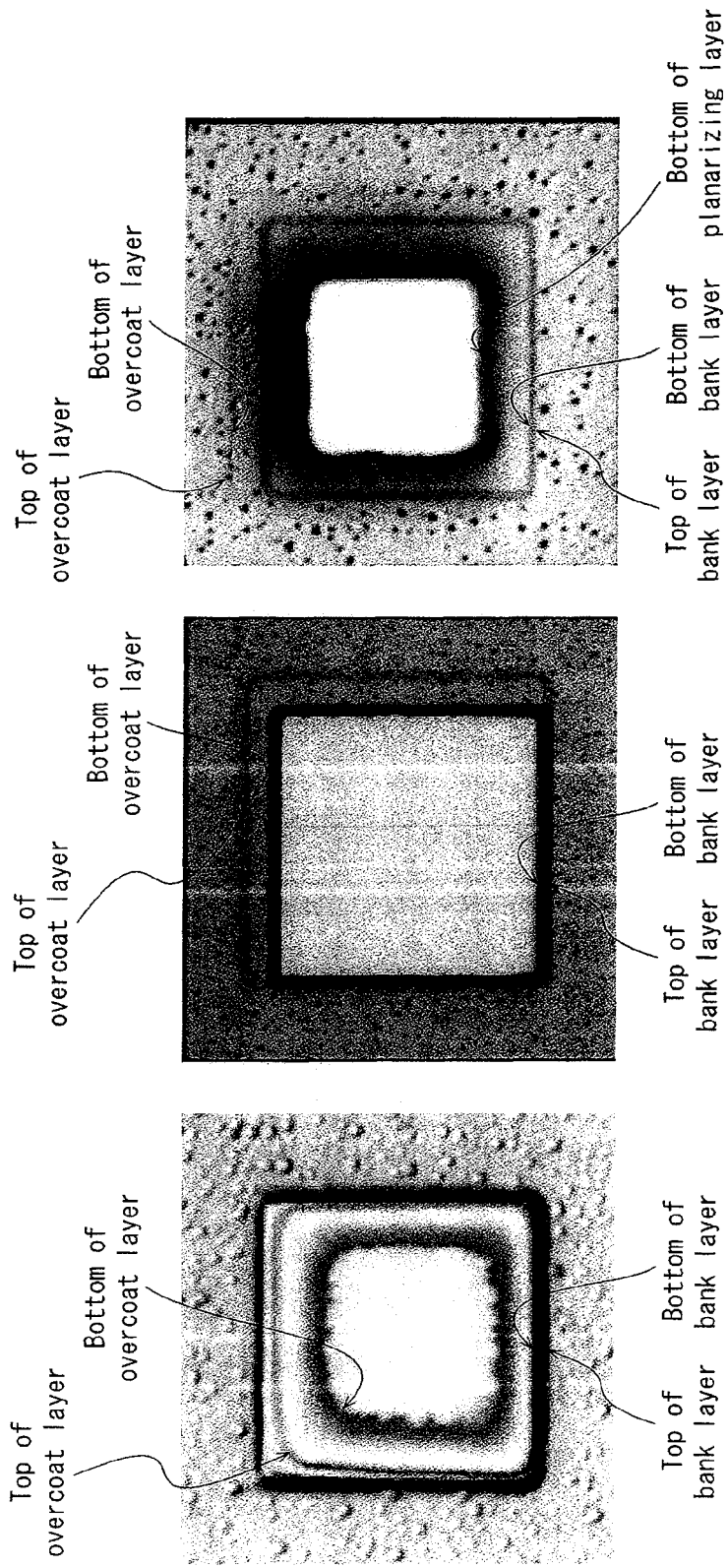
FIGS. 8A, 8B and 8C contains pictures illustrating experiment results.

The inventors created a layered structure including the substrate, bank layer, overcoat layer, and planarizing layer, and observed the structure in plan view. FIG. 8A is a photograph of a Comparative Example before formation of the planarizing layer, and FIG. 9A is a traced drawing and a cross-section diagram thereof. FIG. 8B is a photograph of an Example before formation of the planarizing layer, and FIG. 9B is a traced drawing and a cross-section diagram thereof. FIG. 8C is a photograph of the Example after formation of the planarizing layer, and FIG. 9C is a traced drawing and a cross-section diagram thereof.

In the Comparative Example, the bank layer is formed using a first photomask, and the overcoat layer is formed using a second photomask. The area of the light-blocking regions (the regions for forming the apertures) in the second photomask is smaller than the light-blocking regions (the regions for forming the apertures) in the first photomask. As a result, in the Comparative Example, the area of the apertures in the overcoat layer is smaller than the area of the apertures in the bank layer. On the other hand, in the Example, the bank layer is formed using the second photomask, and the overcoat layer is formed using the first photomask. As a result, in the Example, the area of the apertures in the overcoat layer is larger than the area of the apertures in the bank layer.

In ideal conditions with no stray light, the aperture area is expected to be the same, since the Comparative Example and the Example use the same photomask. Since stray light actually does occur, however, the aperture area differs between the Comparative Example and the Example. In the Comparative Example, as illustrated in the cross-sectional diagram of FIG. 9A, the inclination of the inner circumferential surface of the overcoat layer becomes more gradual closer to the bottom. As a result, the area of the aperture is reduced. In the example, on the other hand, as illustrated in the cross-sectional diagram of FIG. 9B, the inclination of the inner circumferential surface of both the bank layer and the overcoat layer is constant. As a result, the area of the aperture increases.

Figure 10B:
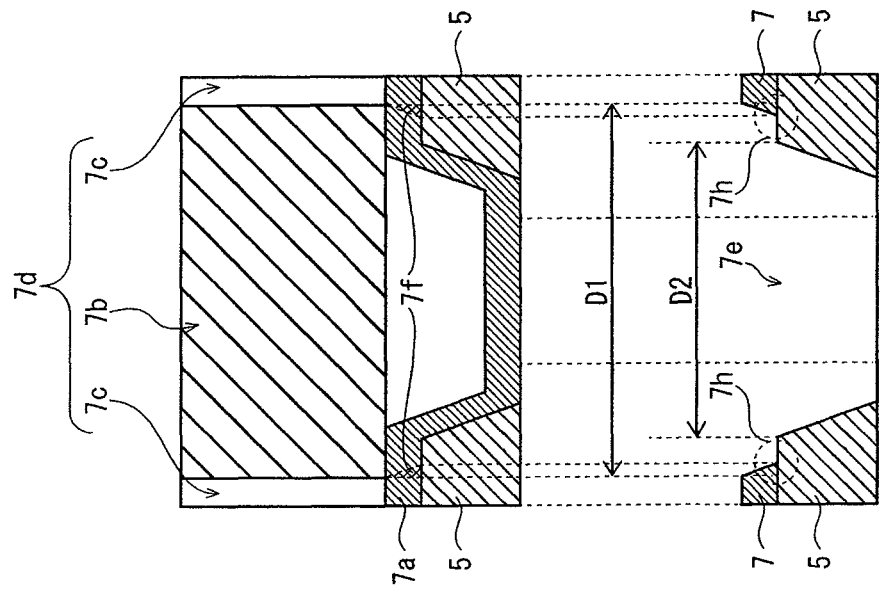
FIGS. 10A and 10B illustrate the principle behind present disclosure.
Figure 10A:
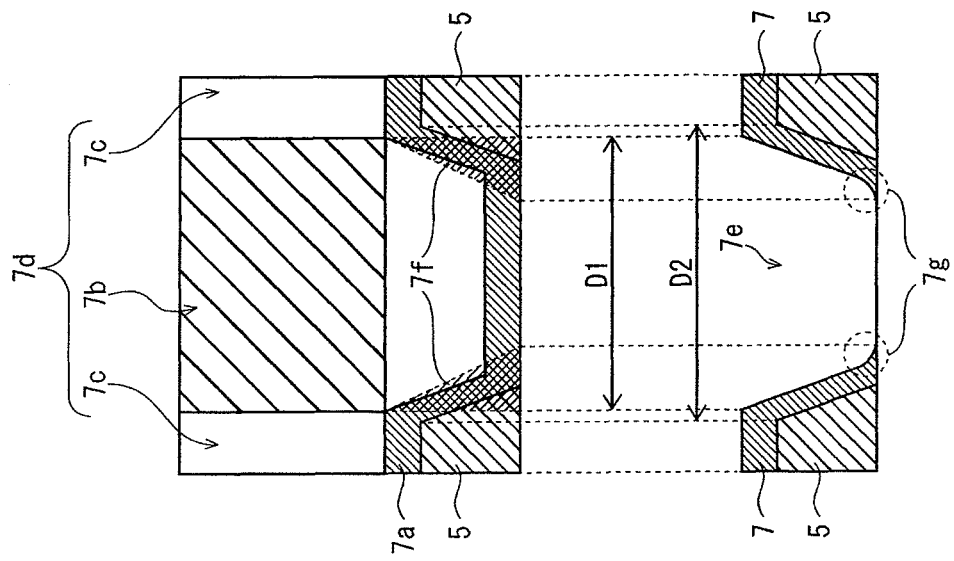

The reason behind this difference is described with reference to FIGS. 10A and 10B. Since the overcoat material layer 7a conforms to the shape of the bank layer 5 underneath, the portions of the overcoat material layer 7a within the apertures of the bank layer 5 are concave with respect to the portions above the bank layer 5. Therefore, when disposing the photomask 7d on the overcoat material layer 7a, a gap occurs between the concave portions and the photomask 7d. Stray light occurs at a constant angle at the boundary between the light-blocking regions 7b and the aperture regions 7c of the photomask 7d. Therefore, as the size of the gap between the photomask 7d and the overcoat material layer 7a increases, the distance over which light strays also increases. In FIG. 10A, the area of the light-blocking regions 7b in the photomask 7d (corresponding to the diameter D1 in FIG. 10A) is smaller than the area of the apertures in the bank layer 5 (corresponding to the diameter D2 in FIG. 10A), and therefore a wide stray light region 7f occurs. This stray light region 7f is partially exposed, causing the overcoat material layer 7a in the stray light region 7f to be only partially removed. The overcoat material layer 7a therefore partially remains after developing. Accordingly, a bottom 7g of the overcoat layer 7 is located towards the center of the aperture, thereby reducing the aperture area. On the other hand, in FIG. 10B, the area of the light-blocking regions 7b in the photomask 7d is larger than the area of the apertures in the bank layer 5, and therefore a narrow stray light region 7f occurs. Accordingly, the portion that partially remains due to partial exposure is reduced, thereby securing the bottom 7h of the overcoat layer 7 in an appropriate position and guaranteeing the aperture area.

Based on this principle, the area of the light-blocking regions 7b in the photomask 7d should be larger than the area of the apertures in the bank layer 5. When comparing the photomask 7d and the photomask 5d, the area of the light-blocking regions 7b in the photomask 7d is often larger than the area of the light-blocking regions 5b in the photomask 5d. Accordingly, the area of the light-blocking regions 7b in the photomask 7d may be made larger than the area of the light-blocking regions 5b in the photomask 5d.

The actual thickness of the bank layer 5 is approximately 1 µm, the thickness of the overcoat layer 7 is approximately 0.3 µm to 0.5 µm, and the thickness of the photomask 7d is approximately 2 µm to 3 µm. When the thickness of the bank layer 5 is thus greater than the thickness of the overcoat layer 7, the problem of stray light becomes particularly prominent, making the adoption of the present embodiment highly effective.

Embodiment 2

In Embodiment 1, the first layer, provided with apertures for the formation of contact holes, is the bank layer 5, and the second layer located on the first layer is the overcoat layer 7, but the present disclosure is not limited in this way. As long as the formation of the apertures in the first layer and the formation of the apertures in the second layer are separate steps, the present disclosure may be applied to any combination of layers.

In Embodiment 2, the first layer, provided with apertures for the formation of contact holes, is the gate insulation film 3, and the second layer is the bank layer 5. Note the description is omitted of structural components that are the same as in Embodiment 1.

Overall Configuration

Figure 11:
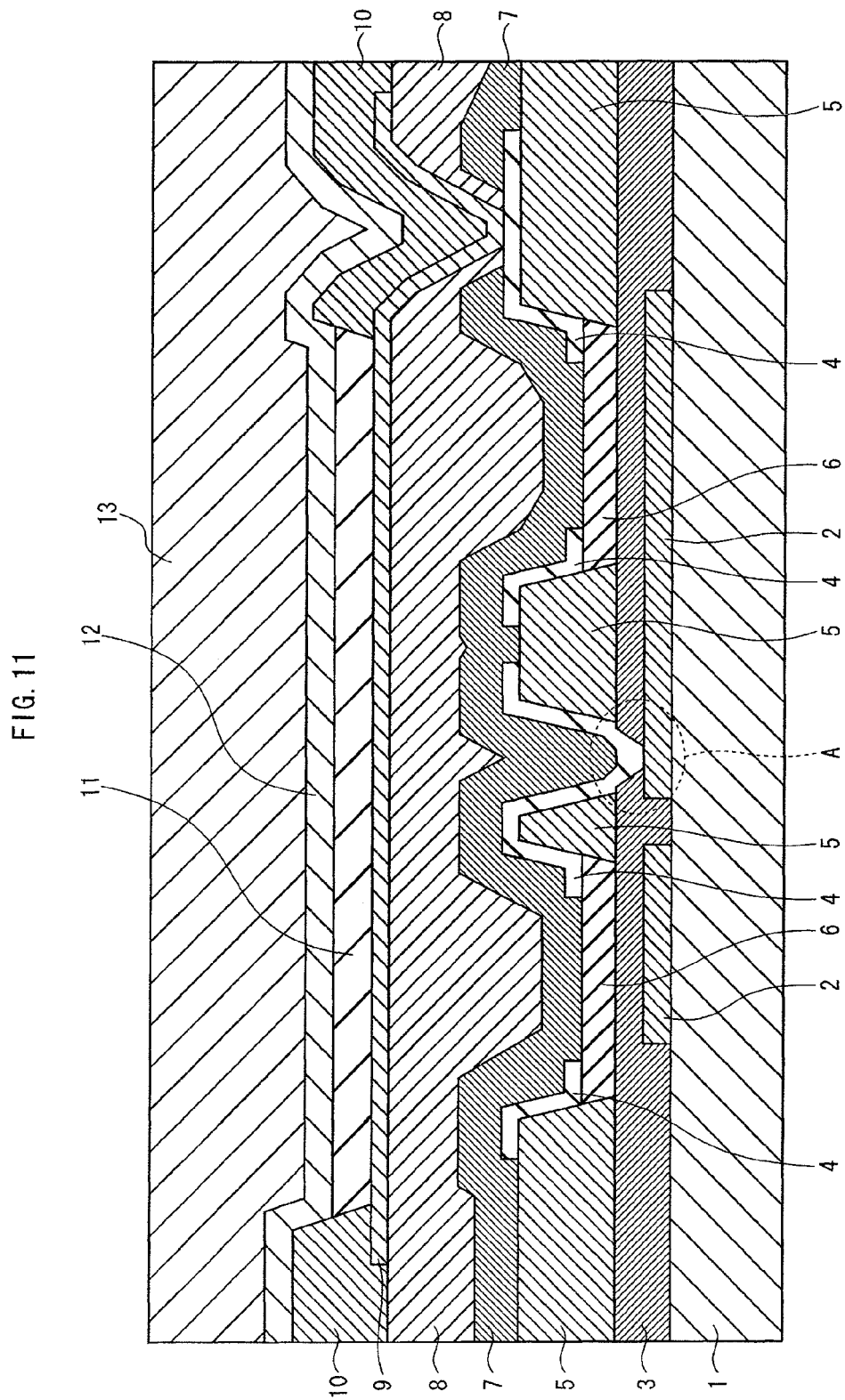
FIG. 11 is a cross-section diagram illustrating the structure of a display panel according to Embodiment 2 of the present disclosure.

FIG. 11 is a cross-section diagram illustrating the structure of a display panel according to Embodiment 2 of the present disclosure. The display panel is provided with a substrate 1, gate electrodes 2, a gate insulation film 3, source-drain electrodes 4, a bank layer 5, semiconductor layers 6, an overcoat layer 7, a planarizing layer 8, pixel electrodes 9, a bank layer 10, organic EL layers 11, a common electrode 12, and a sealing layer 13.

In Embodiment 1, the transistor is a bottom gate-bottom contact type structure, and therefore the source-drain electrodes 4 are located below the semiconductor layers 6. By contrast, in Embodiment 2 the transistor is a bottom gate-top contact type structure, and therefore the source-drain electrodes 4 are located above the semiconductor layers 6.

In section A of FIG. 11, the gate insulation film 3 and the bank layer 5 each have an aperture at a position overlapping the gate electrode 2 in plan view. These apertures form a contact hole. A portion of the source-drain electrode 4 enters into the contact hole along the inner circumferential surface thereof and contacts with the gate electrode 2 that is exposed at the bottom of the contact hole. The portion of the source-drain electrode 4 located within the contact hole functions as a wiring layer that contacts with the gate electrode 2.

Manufacturing Method

FIGS. 12A through 17 are cross-section diagrams illustrating the manufacturing process of the display panel in FIG. 11.

First, the substrate 1 is prepared, and the gate electrodes 2 are formed on the substrate 1. The above steps allow for formation of a substrate underlayer having the gate electrodes 2 formed on the upper surface thereof.

Next, a gate insulation material layer 3a for forming the gate insulation film 3 is formed on the substrate underlayer on which the gate electrodes 2 are formed (FIG. 12A) and a photomask 3d is disposed on the gate insulation material layer 3a. The gate insulation material layer 3a is then exposed via the photomask 3d (FIG. 12B) and subsequently developed. As a result, the gate insulation film 3 is formed to include apertures 3e for the formation of the contact holes (FIG. 12C). Note that the photomask 3d includes light-blocking regions 3b with an extremely low degree of transparency and aperture regions 3c with an extremely high degree of transparency. In the present embodiment, the material for the gate insulation film 3 is a photosensitive material such that during developing, unexposed portions are removed, whereas exposed portions remain. Therefore, in plan view of the photomask 3d, the light-blocking regions 3b overlap the portions of the gate insulation material layer 3a in which the apertures are to be formed, whereas the aperture regions 3c overlap the remaining regions.

Next, a bank material layer 5a for forming the bank layer 5 is formed on the gate insulation film 3 (FIG. 13A) and a photomask 5d is disposed on the bank material layer 5a. The bank material layer 5a is then exposed via the photomask 5d (FIG. 13B) and subsequently developed. This results in formation of the bank layer 5 which has apertures 5e for the formation of the semiconductor layers 6 and apertures 5f for the formation of the contact holes (FIG. 13C). Note that the photomask 5d includes light-blocking regions 5b with an extremely low degree of transparency and aperture regions 5c with an extremely high degree of transparency. In the present embodiment, the material for the bank layer 5 is a photosensitive material such that during developing, unexposed portions are removed, whereas exposed portions remain. Therefore, in plan view of the photomask 5d, the light-blocking regions 5b overlap the portions of the bank material layer 5a in which the apertures are to be formed, whereas the aperture regions 5c overlap the remaining regions. In plan view, the area of the light-blocking regions 5b in the photomask 5d is larger than the area of the apertures 3e in the gate insulation film 3. In other words, as shown in FIG. 13B, the radius D1 of each of the light-blocking regions 5b in the photomask 5d is larger than the radius D2 of each of the apertures in the gate insulation film 3. This difference in size guarantees the area of the contact holes even if stray light occurs during exposure using the photomask 5d.

Figure 14A:
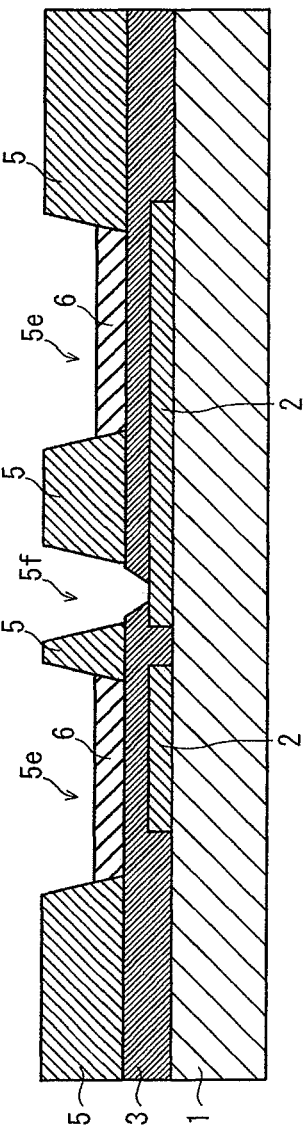
FIGS. 14A, 14B, and 14C are cross-section diagrams illustrating the manufacturing process of the display panel in FIG. 11.

Next, the semiconductor layers 6 are formed in the apertures 5e of the bank layer 5 (FIG. 14A).

Figure 14B:
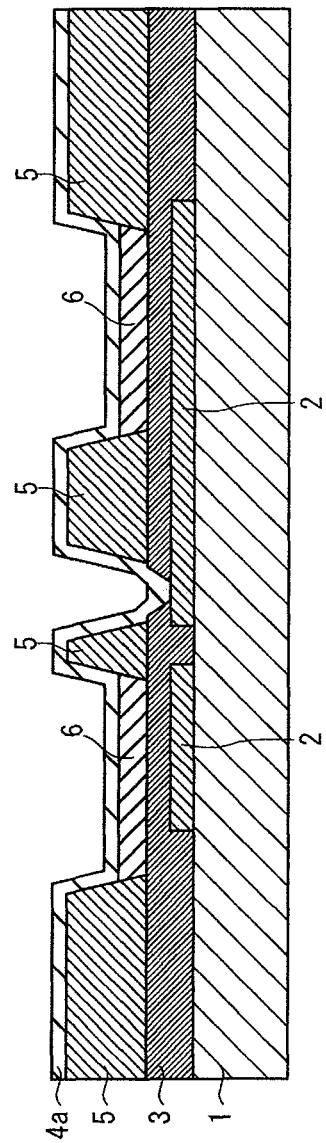
Figure 14C:
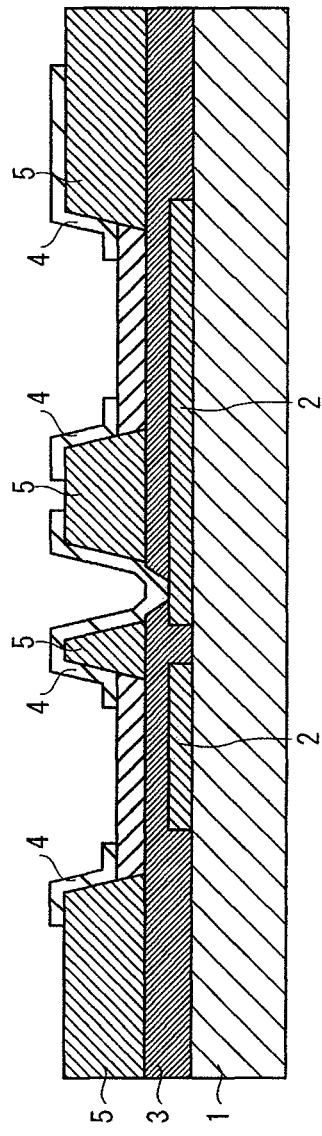

Next, an SD material layer 4a for forming the source-drain electrodes 4 is formed on the bank layer 5, on which are formed the semiconductor layers 6 (FIG. 14B). The SD material layer 4a is then etched, and the source-drain electrodes 4 are formed (FIG. 14C). Note that the source-drain electrodes 4 may be a single layer structure or a multilayer structure. In the case of a single layer structure, the source-drain electrodes 4 may be formed in one step, thereby simplifying the manufacturing process. In the case of a multilayer structure, appropriate material for each layer may be selected in accordance with function. For example, taking into account interlayer resistance with the semiconductors, a material with good charge injection characteristics may be selected for the lower layer, whereas taking into account the coefficient of thermal expansion of the substrate, a durable material may be selected for the upper layer. One example is using copper (Cu) with a thickness of several nanometers as the material for the lower layer and molybdenum (Mo) with a thickness of 50 nm to 100 nm as the material for the upper layer.

Figure 15A:
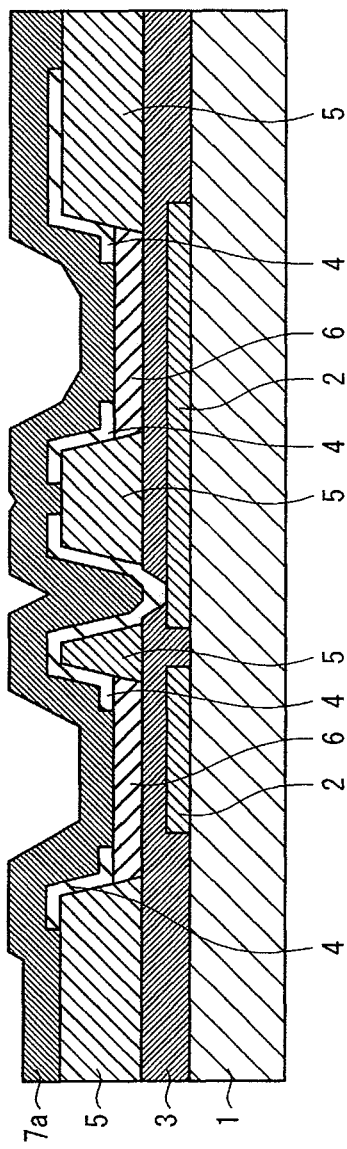
FIGS. 15A and 15B are cross-section diagrams illustrating the manufacturing process of the display panel in FIG. 11.
Figure 15B:
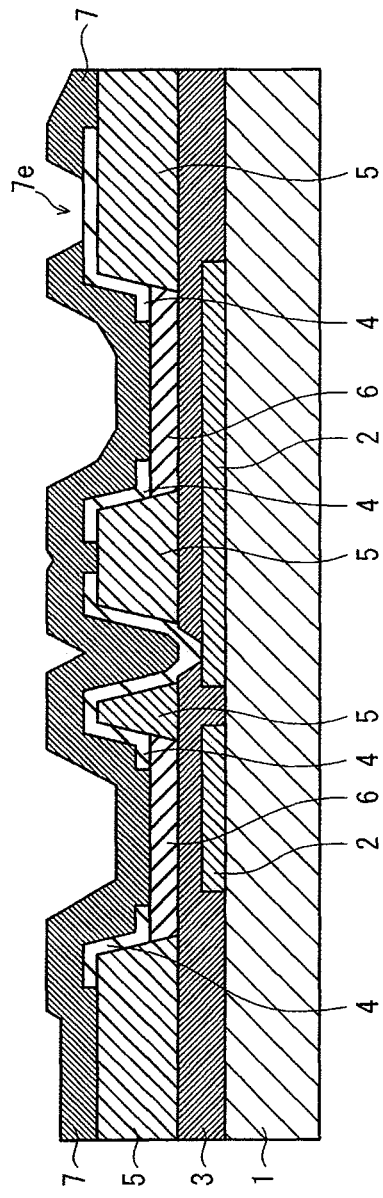

Next, an overcoat material layer 7a for forming the overcoat layer 7 is formed on the bank layer 5 on which the source-drain electrodes 4 are formed (FIG. 15A). The overcoat material layer 7a is then exposed via a photomask and developed to form the overcoat layer 7 so as to include apertures 7e for the formation of the contact holes (FIG. 15B).

Figure 16A:
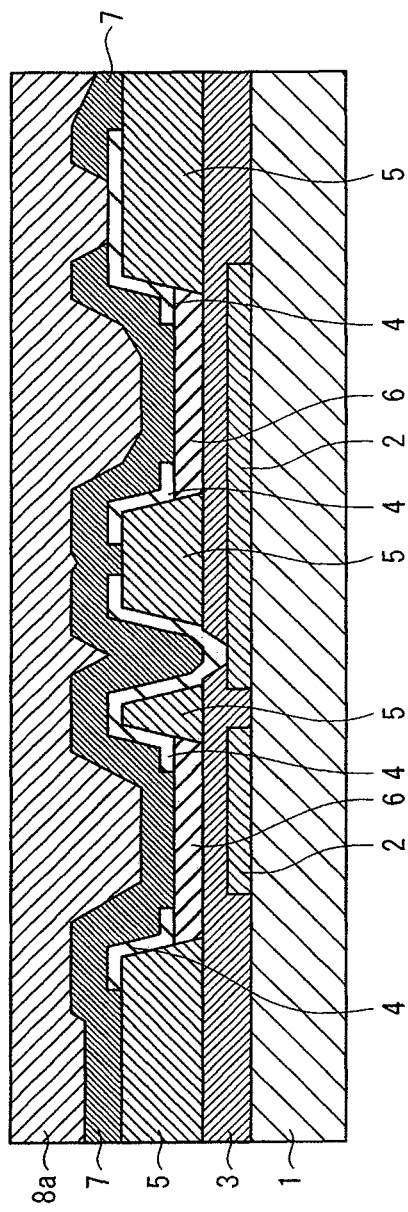
FIGS. 16A and 16B are cross-section diagrams illustrating the manufacturing process of the display panel in FIG. 11.
Figure 16B:
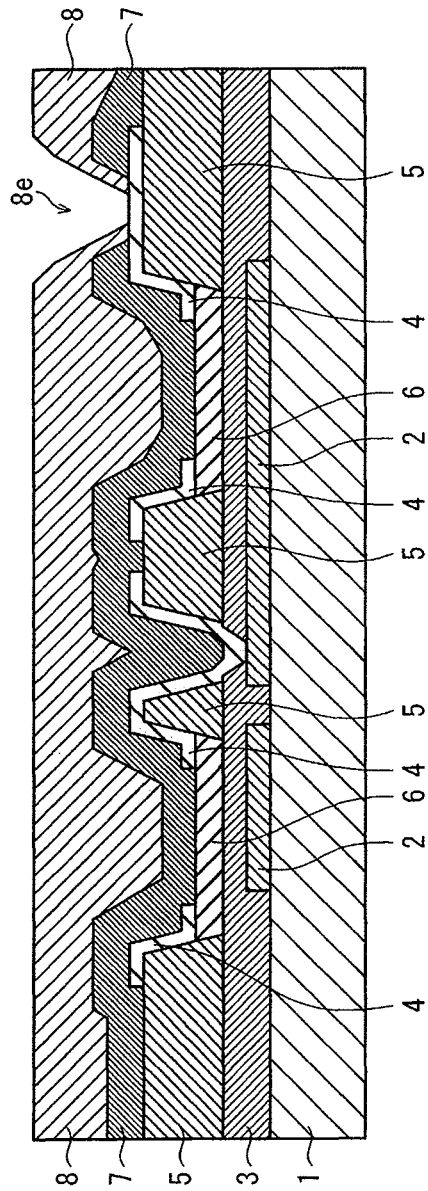

Next, a planarizing material layer 8a for forming the planarizing layer 8 is formed on the overcoat layer 7 in which apertures have been formed (FIG. 16A). The planarizing material layer 8a is then exposed via a photomask and developed to form the planarizing layer 8 so as to include the contact holes 8e (FIG. 16B).

Figure 17:
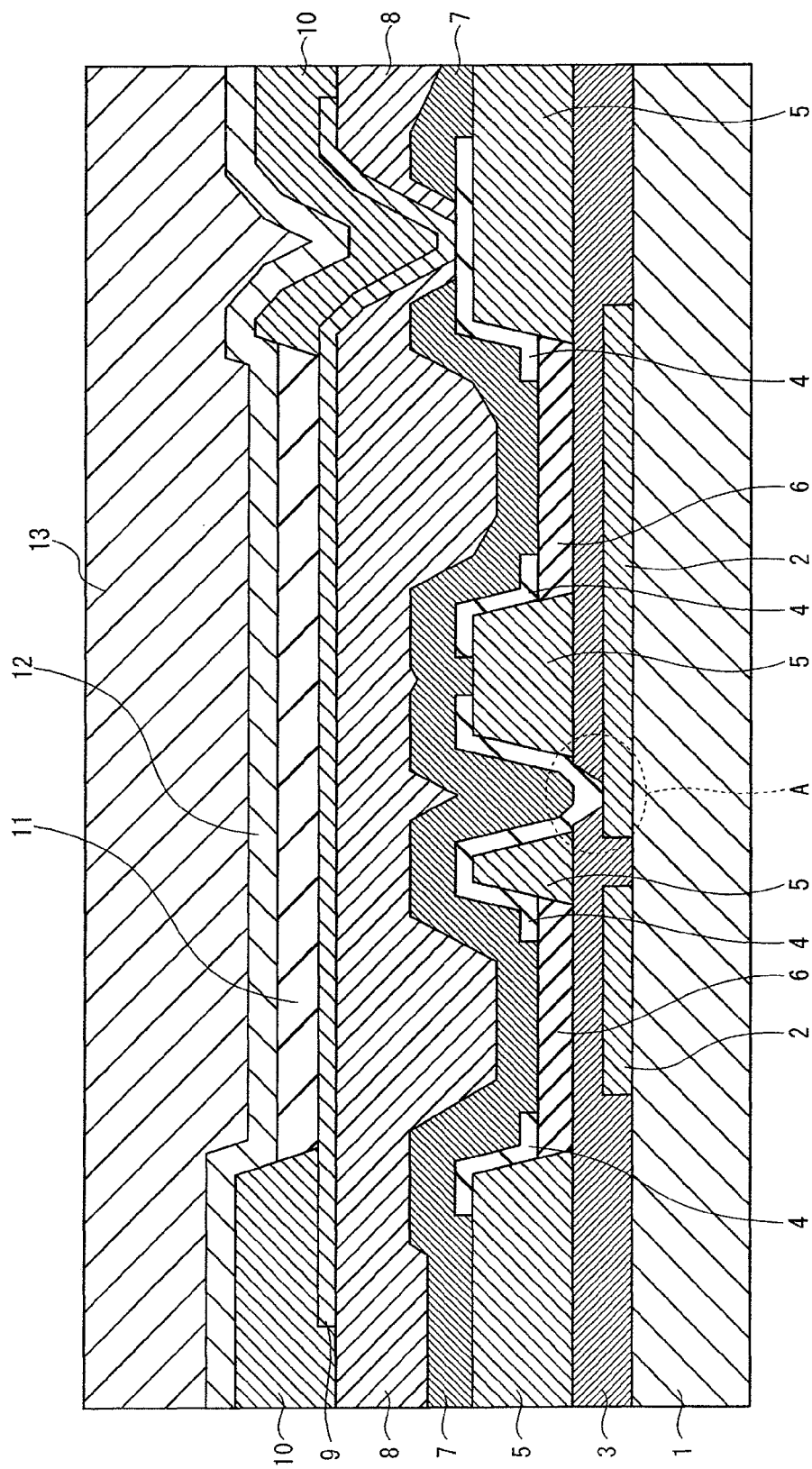
FIG. 17 is a cross-section diagram illustrating the manufacturing process of the display panel in FIG. 11.

Subsequently, the display panel is formed by forming the pixel electrodes 9, the bank layer 10, the organic EL layers 11, the common electrode 12, and the sealing layer 13 in this order (FIG. 17).

Modifications

While embodiments have been described, the present disclosure is not limited to the above embodiments. For example, the following modifications are possible.

(1) Number of Layers

In the embodiments, apertures are formed in each layer of the two-layer structure, but the present disclosure is not limited in this way and may be used in a structure with three layers or more. In this case, the area of the light-blocking regions of the photomask for formation of the $N^{th}$ layer should be larger than the area of the apertures in the $(N-1)^{th}$ layer (N being an integer two or greater).

Figure 18:
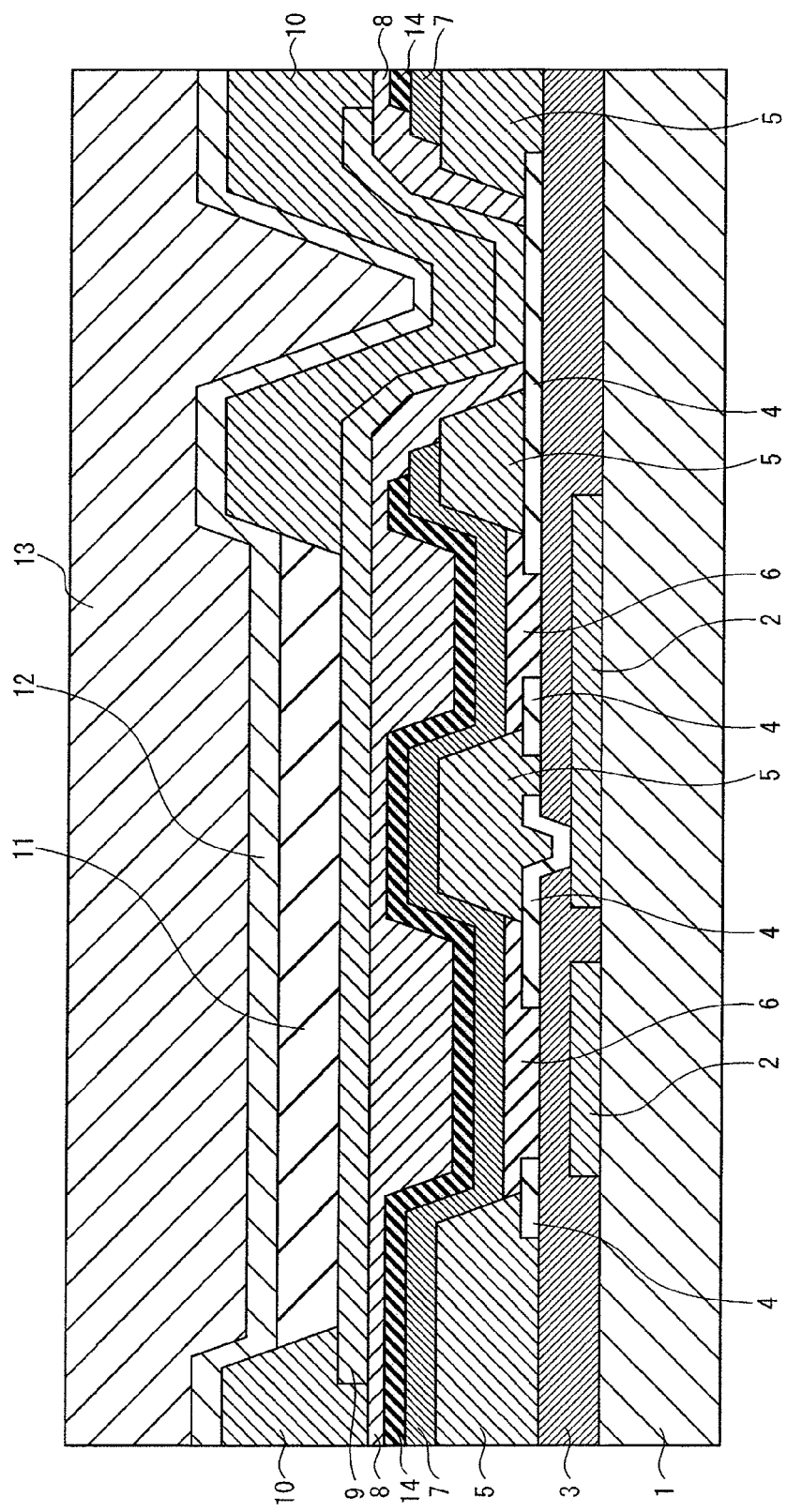
FIG. 18 is a cross-section diagram illustrating the structure of a display panel according to a modification to Embodiment 1 of the present disclosure.

FIG. 18 is a cross-section diagram illustrating the structure of a display panel according to a modification of Embodiment 1. In this example, another overcoat layer 14 is further formed on the overcoat layer 7. Otherwise, the structure is the same as in Embodiment 1. The overcoat layer 14 is formed from material that is insulating and photosensitive and is mainly provided for the purpose of covering the overcoat layer 7. In the overcoat layer 14, apertures for formation of the contact holes are formed.

Figure 19A:
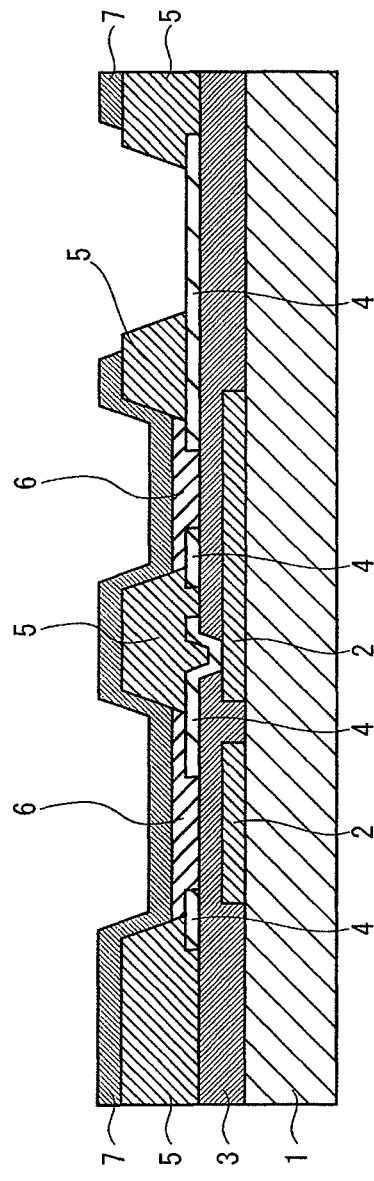
FIGS. 19A and 19B are cross-section diagrams illustrating the manufacturing process of the display panel in FIG. 18.
Figure 19B:
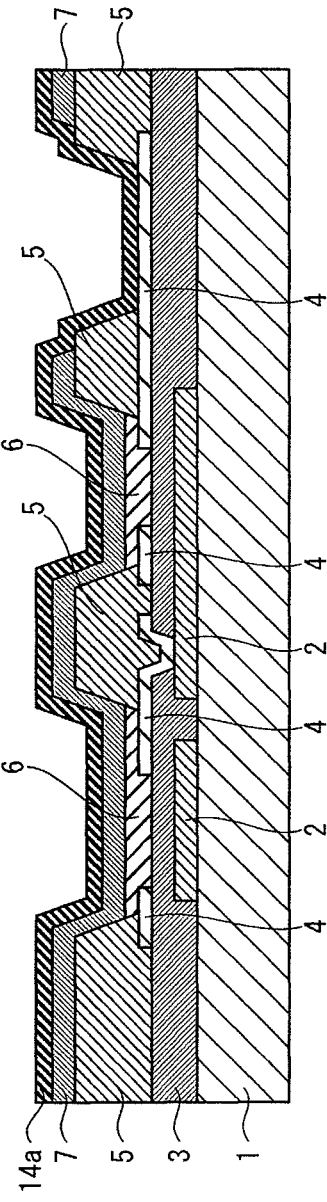

FIGS. 19 and 20 are cross-section diagrams illustrating the manufacturing process of the display panel in FIG. 18.

Figure 20A:
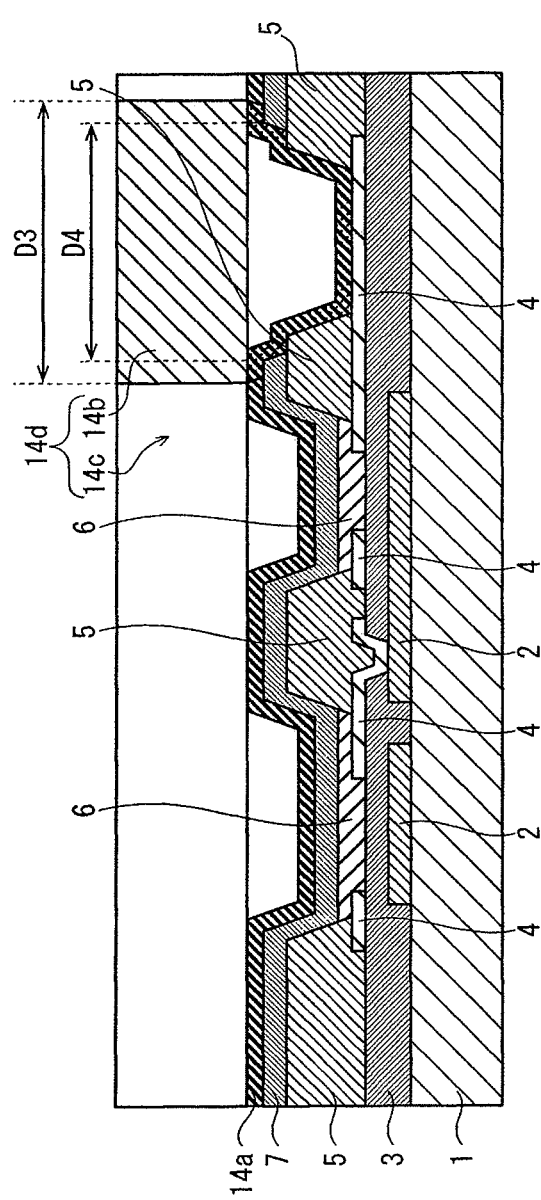
FIGS. 20A and 20B are cross-section diagrams illustrating the manufacturing process of the display panel in FIG. 18.
Figure 20B:
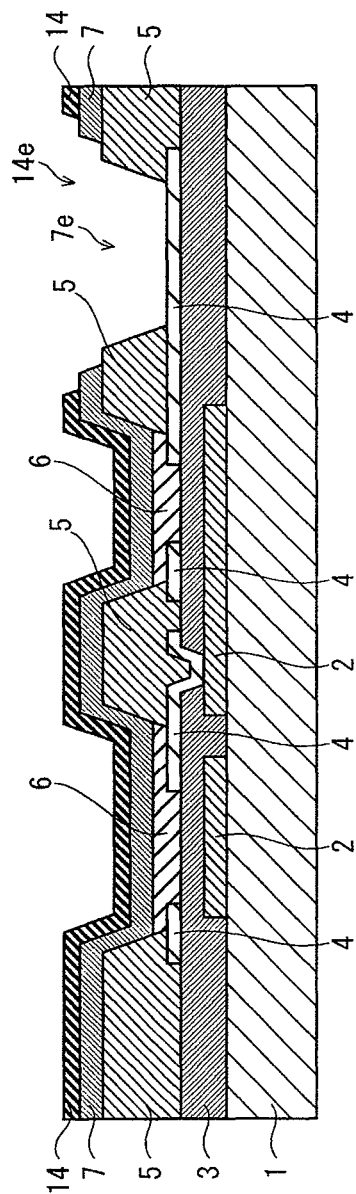

Apertures are formed in the overcoat layer 7 (FIG. 19A), an overcoat material layer 14a for forming the overcoat layer 14 is formed thereon (FIG. 19B), and a photomask 14d is disposed on the overcoat material layer 14a. The overcoat material layer 14a is then exposed via the photomask 14d (FIG. 20A) and subsequently developed. As a result, the overcoat layer 14 is formed to include apertures 14e for the formation of the contact holes (FIG. 20B). The photomask 14d includes light-blocking regions 14b with an extremely low degree of transparency and aperture regions 14c with an extremely high degree of transparency. In the present modification, the material for the overcoat layer 14 is a photosensitive material such that during developing, unexposed portions are removed, whereas exposed portions remain. Therefore, in plan view of the photomask 14d, the light-blocking regions 14b overlap the portions of the overcoat material layer 14a in which the apertures are to be formed, whereas the aperture regions 14c overlap the remaining regions. In plan view, the area of the light-blocking regions 14b in the photomask 14d is larger than the area of the apertures 7e in the overcoat layer 7. In other words, as shown in FIG. 20A, the radius D3 of each of the light-blocking regions 14b in the photomask 14d is larger than the radius D4 of each of the apertures 7e in the overcoat layer 7. As a result, the area of the contact holes is guaranteed even if stray light occurs.

(2) Shape of Apertures

In the embodiments, the planar shape (square) of the apertures in the bank layer 5 and the planar shape (square) the apertures in the overcoat layer 7 are the same, but the present disclosure is not limited in this way. As long as the area of the light-blocking region of the photomask 7d is larger than the area of the apertures in the bank layer 5, the planar shape of the apertures in the bank layer 5 and the planar shape of the apertures in the overcoat layer 7 may differ. Furthermore, in the embodiments, the planar shape of the apertures in the bank layer 5 and the apertures in the overcoat layer 7 is square, but a different shape may be adopted. For example, the shape of the apertures may be a circle, an ellipse, a polygon, or the like.

(3) Type of Photosensitive Material

Figure 21:
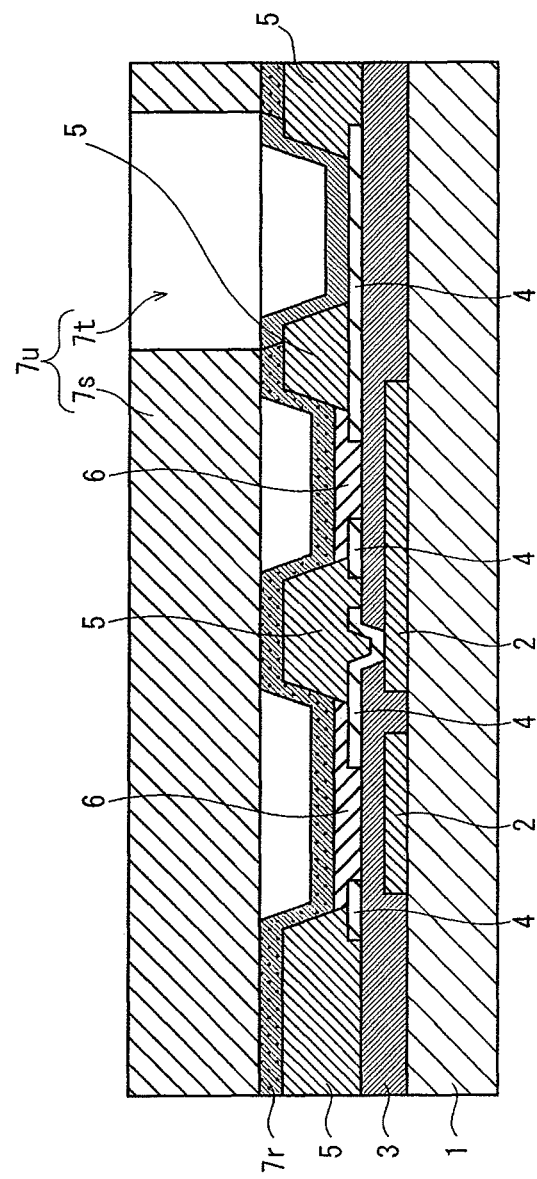
FIG. 21 is a cross-section diagram illustrating the manufacturing process of a display panel according to a modification to Embodiment 1 of the present disclosure.

In the embodiments, the material for the second layer (the overcoat layer 7 in Embodiment 1, and the bank layer 5 in Embodiment 2) is a photosensitive material such that during developing, unexposed portions are removed, whereas exposed portions remain. The present disclosure is not, however, limited in this way, and the opposite type of photosensitive material may be used. For example, when using the opposite type in Embodiment 1, as illustrated in FIG. 21, in plan view of a photomask 7u, aperture regions 7t overlap the portions of an overcoat material layer 7r in which the apertures are to be formed, whereas light-blocking regions 7s overlap the remaining regions. The area of each of the aperture regions 7t in the photomask 7u is set to be larger than the area of each of the apertures in the overcoat layer 7. The same is true when using the opposite type of photosensitive material in Embodiment 2 as well.

(4) Example of Application to a Display Device

Figure 22:
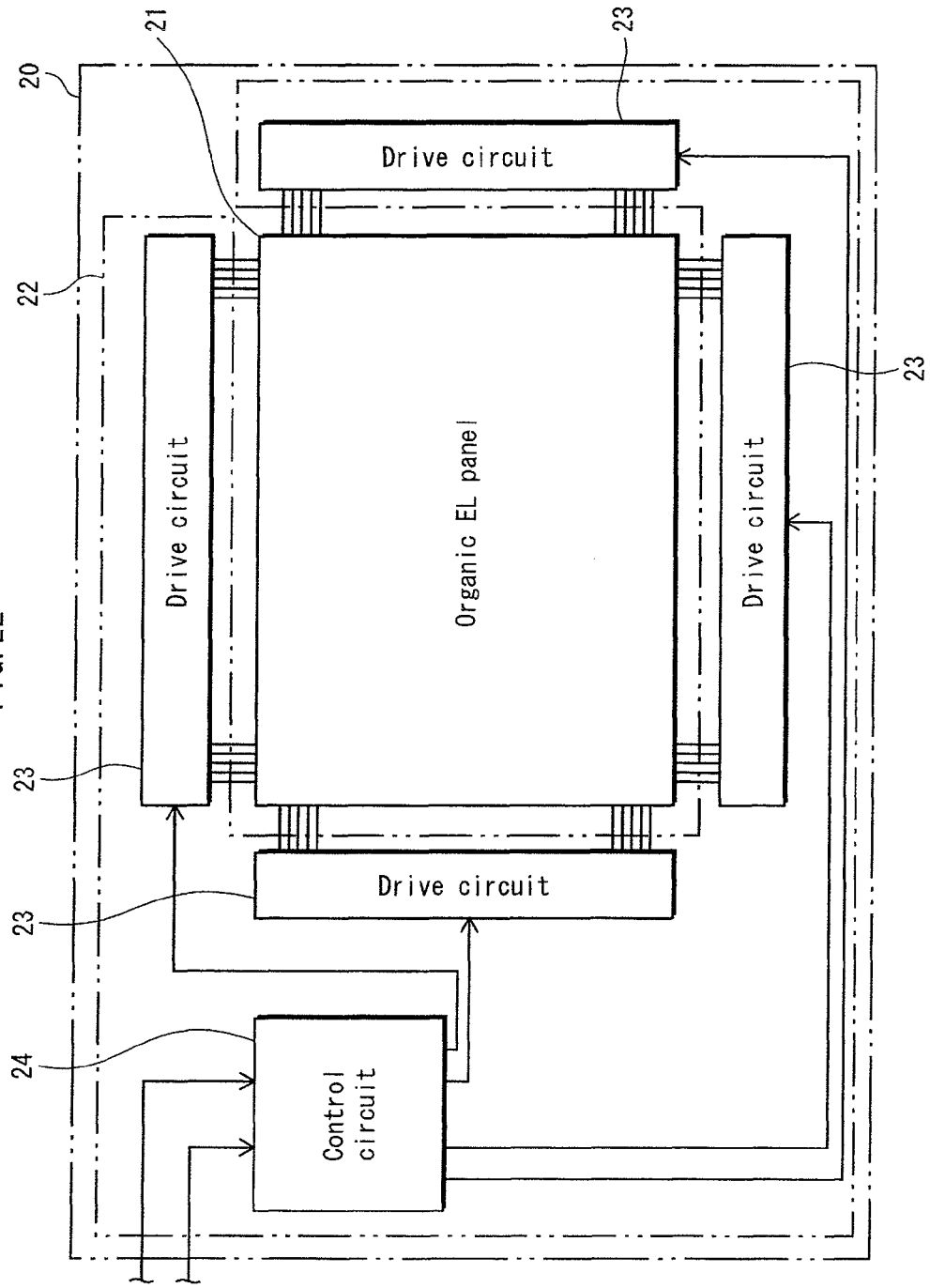
FIG. 22 illustrates functional blocks when the display panel of FIG. 1 is applied to a display device.
Figure 23:
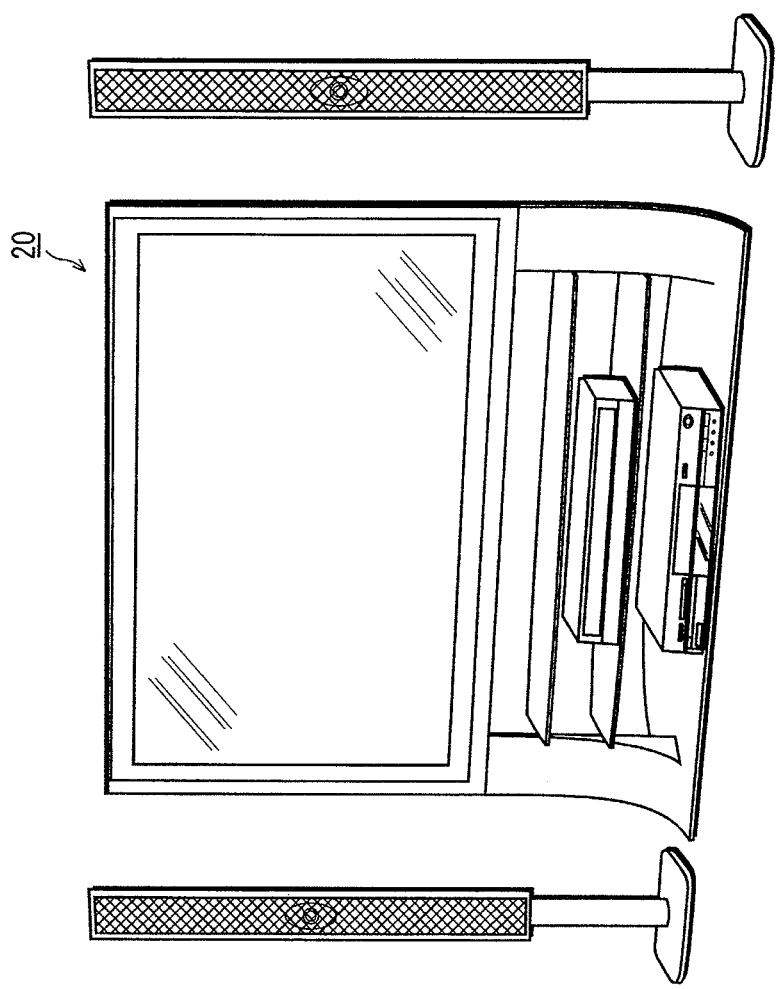
FIG. 23 is an external view of the display device in FIG. 22.
Figure 24:
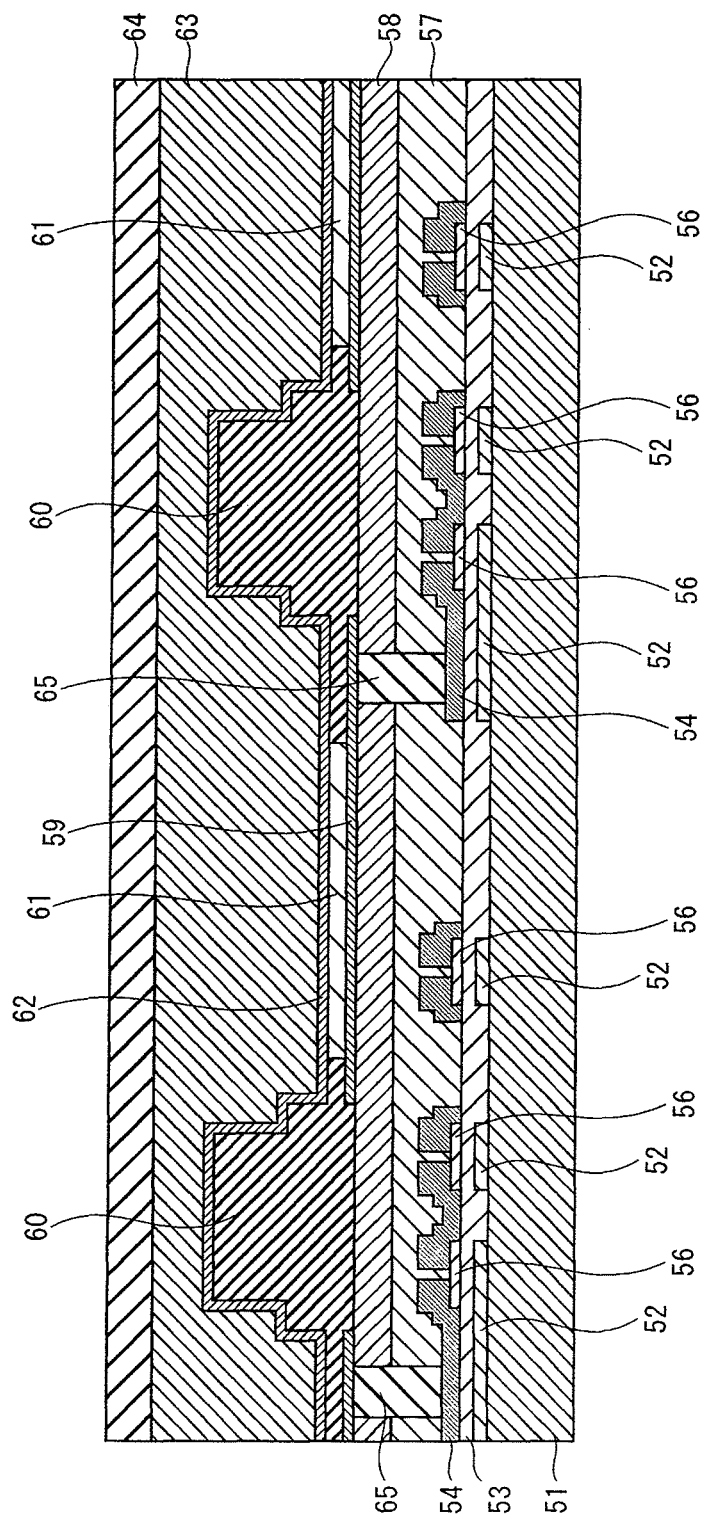
FIG. 24 is a cross-section diagram illustrating the structure of the organic EL panel disclosed in Patent Literature 1.

FIG. 22 illustrates functional blocks when the display panel of FIG. 1 is applied to a display device. FIG. 23 is an external view of the display device in FIG. 22. The display device 20 includes a display panel 21 and a drive control unit 22 electrically connected thereto. The drive control unit 22 includes drive circuits 23 and a control circuit 24 that controls operations of the drive circuits 23.

INDUSTRIAL APPLICABILITY

The present disclosure is applicable to organic EL displays and the like.

REFERENCE SIGNS LIST 1 substrate
2 gate electrode
3 gate insulation film
3a gate insulation material layer
3b light-blocking region
3c aperture region
4 source-drain electrode
4a SD material layer
4b resist pattern
5 bank layer
5a bank material layer
5b light-blocking region
5c aperture region
5d photomask
6 semiconductor layer
7 overcoat layer
7a overcoat material layer
7b light-blocking region
7c aperture region
7d photomask
7r overcoat material layer
7s light-blocking region
7t aperture region
7u photomask
8 planarizing layer
8a planarizing material layer
8b light-blocking region
8c aperture region
8d photomask
8e contact hole
9 pixel electrode 10 bank layer
11 organic EL layer
12 common electrode
13 sealing layer
14 overcoat layer
14a overcoat material layer
14b light-blocking region
14c aperture region
14d photomask
20 display device
21 display panel
22 drive control unit
23 drive circuit
24 control circuit
51 substrate
52 gate electrode
53 gate insulation film
54 source-drain electrode
56 semiconductor layer
57 passivation film
58 planarizing film
59 pixel electrode
60 bank
61 organic EL layer
62 common electrode
63 sealing resin layer
64 sealing substrate
65 contact metal

The invention claimed is:

1. A method of manufacturing a display panel, comprising:
preparing a substrate with an electrode on an upper surface thereof;
forming, on the substrate, a gate insulation film including a first aperture overlapping the electrode in plan view;
forming, on the gate insulation film, a bank layer including a second aperture overlapping the first aperture in plan view, and a third aperture which is at a different position than the second aperture and in which a functional material layer is to be formed; and
forming a wiring layer, in contact with the electrode, inside the overlapping first aperture and second aperture, wherein
the bank layer is formed from a photosensitive material,
formation of the bank layer includes:
forming, on the gate insulation film, a first photosensitive material layer for formation of the bank layer;
disposing, over the first photosensitive material layer, a first photomask having a different degree of transparency in a first region and a second region thereof, the first region of the first photomask overlapping the first photosensitive material layer, in plan view, at locations for formation of the second aperture and the third aperture, and the second region of the first photomask being a remainder of the first photomask other than the first region of the first photomask; and
exposing the first photosensitive material layer via the first photomask, and
in plan view, an area of the first region of the photomask is larger than an area of the first aperture of the gate insulation film.

2. The method of manufacturing a display panel of claim 1, wherein
the gate insulation film is formed from a photosensitive material,
formation of the gate insulation film includes:
forming, on the substrate, a second photosensitive material layer for formation of the gate insulation film;
disposing, over the second photosensitive material layer, a second photomask having a different degree of transparency in a first region and a second region thereof, the first region of the second photomask overlapping the second photosensitive material layer, in plan view, at a location for formation of the first aperture, and the second region of the second photomask being a remainder of the second photomask other than the first region of the second photomask; and
exposing the second photosensitive material layer via the second photomask, and
in plan view, an area of the first region of the first photomask is larger than an area of the first region of the second photomask.

3. The method of manufacturing a display panel of claim 1, wherein the gate insulation film is formed from photosensitive material.

4. A method of manufacturing a display panel, comprising:
preparing a substrate with an electrode on an upper surface thereof;
forming, on the substrate, a gate insulation film;
forming, in the gate insulation film, a first aperture overlapping the electrode in plan view;
forming a bank layer on the gate insulation film and inside the first aperture;
forming, in the bank layer, a second aperture overlapping the first aperture in plan view, and a third aperture which is at a different position than the second aperture and in which a functional material layer is to be formed; and
forming a wiring layer, in contact with the electrode, inside the overlapping first aperture and second aperture, wherein
the bank layer is formed from a photosensitive material,
formation of the second aperture includes:
disposing, over the bank layer, a photomask having a different degree of transparency in a first region and a second region thereof, the first region overlapping the bank layer, in plan view, at locations for formation of the second aperture and the third aperture, and the second region being a remainder of the photomask other than the first region; and
exposing the bank layer via the photomask, and
in plan view, an area of the first region of the photomask is larger than an area of the first aperture in the gate insulation film.

5. The method of manufacturing a display panel of claim 4, wherein the gate insulation film is formed from photosensitive material.

* * * * *